United States Patent
Komatsu et al.

(10) Patent No.: US 8,139,131 B2
(45) Date of Patent: Mar. 20, 2012

(54) SOLID STATE IMAGING DEVICE AND FABRICATION METHOD THEREOF, AND CAMERA INCORPORATING THE SOLID STATE IMAGING DEVICE

(75) Inventors: Tomoko Komatsu, Kyoto (JP); Toshihiro Higuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 1284 days.

(21) Appl. No.: 11/333,339

(22) Filed: Jan. 18, 2006

(65) Prior Publication Data

US 2006/0158547 A1    Jul. 20, 2006

(30) Foreign Application Priority Data

Jan. 18, 2005 (JP) ................. 2005-010710
Mar. 14, 2005 (JP) ................. 2005-071660

(51) Int. Cl.
H04N 3/14 (2006.01)
H01L 21/00 (2006.01)
H01L 27/00 (2006.01)
H01L 31/062 (2006.01)

(52) U.S. Cl. ........ 348/294; 438/70; 250/208.1; 257/291

(58) Field of Classification Search .................. 348/348, 348/294; 438/70; 250/208.1; 257/290–294
See application file for complete search history.

(56) References Cited

U.S. PATENT DOCUMENTS

| | | | |
|---|---|---|---|
| 5,404,005 A * | 4/1995 | Shimomura et al. | 250/208.1 |
| 5,734,456 A * | 3/1998 | Takao et al. | 349/106 |
| 7,511,750 B2 * | 3/2009 | Murakami | 348/294 |
| 2002/0004298 A1 * | 1/2002 | Sugahara et al. | 438/623 |
| 2007/0040102 A1 * | 2/2007 | Mouli | 250/214.1 |

FOREIGN PATENT DOCUMENTS

| | | |
|---|---|---|
| JP | 60-166904 | 8/1985 |
| JP | 02-084766 | 3/1990 |
| JP | 2-84766 A | 3/1990 |
| JP | 4-74470 | 3/1992 |
| JP | 4-74470 A | 3/1992 |
| JP | 4-273475 A | 9/1992 |
| JP | 06-053451 | 2/1994 |
| JP | 2604890 B2 | 1/1997 |
| JP | 11-307748 | 11/1999 |
| JP | 2000-174246 | 6/2000 |
| JP | 3158466 B2 | 2/2001 |
| JP | 2001-237405 | 8/2001 |
| JP | 2001237405 A * | 8/2001 |
| JP | 2002-076312 | 3/2002 |

OTHER PUBLICATIONS

Japanese Office Action, with English translation, issued in Japanese Patent Application No. 2006-009083, mailed Jul. 14, 2009.

(Continued)

*Primary Examiner* — Lin Ye
*Assistant Examiner* — Mekonnen Dagnew
(74) *Attorney, Agent, or Firm* — McDermott Will & Emery LLP

(57) ABSTRACT

A solid state imaging device of the present invention comprises: a semiconductor substrate; a plurality of light receiving elements arranged in a matrix configuration on the semiconductor substrate; a plurality of color filter segments provided above the light receiving elements; and a light collector provided above the color filter segments for collecting light on the light receiving elements. The color filter segments are mutually separated by interstices. The interstices contain a gas.

26 Claims, 15 Drawing Sheets

OTHER PUBLICATIONS

Chinese Office Action, w/ English translation thereof, issued in Patent Application No. 2006100014353 dated on Sep. 5, 2008.

Japanese Office Action, with English translation, issued in Japanese Patent Application No. 2006-009083, dated Jun. 15, 2010.

* cited by examiner

SOLID STATE IMAGING DEVICE AND FABRICATION METHOD THEREOF, AND CAMERA INCORPORATING THE SOLID STATE IMAGING DEVICE

BACKGROUND OF THE INVENTION

The present invention relates to a solid state imaging device incorporating an on-chip color filter, a fabrication method thereof, and a camera incorporating the solid state imaging device.

Conventionally, solid state imaging devices which have a photoelectric converter for converting light to electric charges, such as a CCD solid state imaging device, a MOS solid state imaging device, etc., have been used in various image capturing apparatuses, such as video cameras, digital still cameras, facsimile machines, etc.

A known example of these solid state imaging devices is a color solid state imaging device which has a color filter. A conventional color solid state imaging device includes a primary-color filter of red (R), blue (B) and green (G) or a complementary-color filter of cyan (C), magenta (M), yellow (Y) and green (G), which is stacked over the light receiving surface of two-dimensionally arranged light receiving elements of a solid state imaging element. The color filter has a predetermined pattern such that each color segment corresponds to one light receiving element. The color filter stacked over the light receiving surface of the light receiving elements is generally called an "on-chip filter".

Light entering the color solid state imaging device is not necessarily perpendicular to the light receiving surface of the color solid state imaging device. If light diagonally entering the light receiving surface passes through one color filter segment diagonally to reach a light receiving element corresponding to an adjacent color filter segment, color mixture occurs.

A known structure which overcomes such a color mixture problem is a color solid state imaging device 91 shown in FIG. 19, wherein light-shielding black films 96a to 96c are provided at boundaries (pixel boundaries) of light-receiving pixel regions in which photodiodes (PDs) are placed (see Japanese Laid-Open Patent Publication No. 2-084766). FIG. 19 is a cross-sectional view schematically illustrating the structure of the conventional color solid state imaging device. The color solid state imaging device shown in FIG. 19 is fabricated through the fabrication steps described below.

First, a dyeable resin is applied at the pixel boundaries on the imaging surface of the solid state imaging device 91 and patterned so as to have a predetermined thickness. The patterned resin is dyed with black dye to form first light-shielding films 96a. Then, a dyeable resin is applied to predetermined ones of the regions defined by the first light-shielding films 96a and then patterned and dyed to form first color filter segments (R) 93.

Then, a transparent anti-dyeing film 97 is formed over the light-receiving surface on which the first light-shielding films 96a and the color filter segments (R) 93 have been formed. Thereafter, on the transparent anti-dyeing film 97, a dyeable resin is applied to a predetermined thick and patterned, and the patterned resin is dyed with black dye, whereby second light-shielding films 96b are formed at the pixel boundaries. Then, a dyeable resin is applied to predetermined ones of the regions defined by the second light-shielding films 96b and then patterned and dyed to form second color filter segments (G) 94.

Then, in the same way, a transparent anti-dyeing film 98, third light-shielding films 96c, and third color filter segments (B) 95 are formed. Lastly, a transparent anti-dyeing film 99 is formed as a protection layer.

With the light-shielding black films 96a to 96c formed at the pixel boundaries, for example, the light which has diagonally entered and passed through the color filter segment (B) 95 is interrupted by the light-shielding films 96a to 96c so as not to reach an adjacent light-receiving pixel region (PD portion) 92. With this structure, color mixture which would be caused by diagonal light can be prevented.

The solid state imaging device has a flattening layer, a color filter layer, and a light-collection lens layer over each of light-receiving sections formed on a substrate. Presently, the light-collection lens is formed through a thermal flow process or by lens pattern transfer using a dry etching technique.

According to a lens formation technique disclosed in Japanese Patent No. 2604890, a photosensitive resist is applied over the upper surface of a substrate and heated at the first temperature. The resist is selectively exposed to light to form a pattern. The pattern is decolored by entire-surface exposure. The patterned and decolored resist is thermally deformed at the second temperature and thermally cured at the third temperature which is higher than the second temperature. The refractive index of the photosensitive resist is about 1.6 where the refractive index of air is 1. When a light-collection lens made of this photosensitive resist is used, the amount of collected light in each pixel is increased, and the photosensitivity is approximately doubled, as compared with a case where a light-collection lens is not formed. However, in this method, the photosensitive resist is restricted not only as to the optical characteristics but also as to various other characteristics, such as application characteristics, patterning characteristics, thermal-flow characteristics, thermal resistance, etc. Thus, selection of the material is not easy. In other words, the process accuracy depends on selection of the photosensitive resist.

According to a lens formation technique disclosed in Japanese Patent No. 3158466, a non-photosensitive polyimide material is applied and then thermally cured. Thereafter, a first photoresist is applied over the non-photosensitive material layer and selectively exposed to light such that a portion of the first photoresist layer above an electrode pad portion is removed. A second photoresist is applied over the resultant structure and selectively removed from the regions corresponding to the light-receiving sections. Thereafter, the resultant structure is heated to form a first light-collection lens template. Then, the first light-collection lens template is etched back to be transferred to the first photoresist layer, whereby a second light-collection lens template is formed. Thereafter, the second light-collection lens template is transferred to the non-photosensitive material layer to form a light-collection lens. The material of this light-collection lens is not restricted as to patterning characteristics or thermal-flow characteristics and therefore enjoys a broader range of material selection as compared with the technique disclosed in Japanese Patent No. 2604890.

The structure disclosed in Japanese Laid-Open Patent Publication No. 2-084766 requires a large number of steps, i.e., (1) formation of light-shielding black film; (2) formation of first color filter; (3) formation of anti-dyeing film; (4) formation of light-shielding black film; (5) formation of second color filter; (6) formation of anti-dyeing film; (7) formation of light-shielding black film; (8) formation of third color filter; and (9) formation of protection layer. Further, as the dimensions of each pixel are decreased because of size reduction or an increased number of pixels of a solid state imaging device, formation of a light-shielding black film pattern by lithography becomes more difficult.

In the technique disclosed in Japanese Patent No. 3158466, the non-photosensitive material has to be diluted with a solvent before being applied onto the substrate. Thus, the stability of the material is poor. Further, since the material is diluted with a solvent, the electron density of the non-photosensitive material decreases, and accordingly, the refractive index of the material decreases.

SUMMARY OF THE INVENTION

In view of the above, an objective of the present invention is to provide a solid state imaging device having small-sized pixels in which color mixture by diagonal light is prevented through a simpler fabrication process. Another object of the present invention is to readily form a highly-refractive lens from a stable material in a formation method of a light-collection lens of a solid state imaging device.

According to the first aspect of the present invention, a solid state imaging device comprises: a semiconductor substrate; a plurality of light receiving elements arranged in a matrix configuration on the semiconductor substrate; a plurality of color filter segments provided above the light receiving elements, the color filter segments being mutually separated by interstices; and a light collector provided above the color filter segments for collecting light on the light receiving elements, wherein the interstices contain a gas.

In the solid state imaging device according to the first aspect of the present invention, a component of light diagonally entering a color filter in a pixel is reflected by a wall of the color filter due to a difference in refractive index between the color filter and the air, and therefore, the use efficiency of light is increased. Further, a component of light diagonally entering a color filter in a pixel is refracted at a wall of the color filter, whereby entry of the light into an adjacent light receiving element is prevented. With this structure, color mixture which would be caused by diagonal light entering from an adjacent pixel can be prevented. In the solid state imaging device according to the first aspect of the present invention, it is not necessary to form light-shielding black films of narrow pattern width which are required in a conventional solid state imaging device. Thus, the pixel size can be decreased.

According to the second aspect of the present invention, a solid state imaging device comprises: a semiconductor substrate; a plurality of light receiving elements arranged in a matrix configuration on the semiconductor substrate; a plurality of color filter segments provided above the light receiving elements, the color filter segments being mutually separated by interstices; and a light collector provided above the color filter segments for collecting light on the light receiving elements, wherein the interstices are filled with a material which has a refractive index lower than that of the color filter segments.

In the solid state imaging device according to the second aspect of the present invention, a component of light diagonally entering a color filter in a pixel is reflected by a wall of the color filter due to a difference in refractive index between the color filter and the low refractive material, and therefore, the use efficiency of light is increased. Further, a component of light diagonally entering a color filter in a pixel is refracted at a wall of the color filter, whereby entry of the light into an adjacent light receiving element is prevented. With this structure, color mixture which would be caused by diagonal light entering from an adjacent pixel can be prevented. In the solid state imaging device according to the second aspect of the present invention, it is not necessary to form light-shielding black films of narrow pattern width which are required in a conventional solid state imaging device. Thus, the pixel size can be decreased.

According to the third aspect of the present invention, a solid state imaging device comprises: a semiconductor substrate; a plurality of light receiving elements arranged in a matrix configuration on the semiconductor substrate; a plurality of color filter segments provided above the light receiving elements, the color filter segments being mutually separated by interstices; and a light collector provided above the color filter segments for collecting light on the light receiving elements, wherein the interstices are filled with a material which contains an organic pigment.

In the solid state imaging device according to the third aspect of the present invention, a component of light diagonally entering a color filter in a pixel is reflected by a wall of the color filter due to a difference in refractive index between the color filter and the organic pigment material, and therefore, the use efficiency of light is increased. Further, a component of light diagonally entering a color filter in a pixel is refracted at a wall of the color filter, whereby entry of the light into an adjacent light receiving element is prevented. With this structure, color mixture which would be caused by diagonal light entering from an adjacent pixel can be prevented. In the solid state imaging device according to the third aspect of the present invention, it is not necessary to form light-shielding black films of narrow pattern width which are required in a conventional solid state imaging device. Thus, the pixel size can be decreased.

In the solid state imaging devices according to the first to third aspects of the present invention, the semiconductor substrate may be a part of a chip; in a central region of the chip, side surfaces of the color filter segments may be perpendicular to an upper surface of the semiconductor substrate; and in a region outside the central region of the chip, side surfaces of the color filter segments may be inclined from a direction perpendicular to the upper surface of the semiconductor substrate. In this case, displacement of light reflected by the color filter can be corrected at the chip periphery region. Thus, decrease in light amount in an image periphery region can be prevented.

In the solid state imaging devices according to the first to third aspects of the present invention, the semiconductor substrate is a part of a chip; in a central region of the chip, the interstices exist above the boundaries between the light receiving elements; and in a region outside the central region of the chip, the interstices are displaced from positions above the boundaries between the light receiving elements. In this case, displacement of light reflected by the color filter can be corrected at the chip periphery region. Thus, decrease in light amount in an image periphery region can be prevented.

In the solid state imaging devices according to the first to third aspects of the present invention, each of the interstices has an upwardly tapered shape. In this case, when light diagonally entering a color filter from an adjacent lens passes through the upper part of the color filter, color mixture with the color of an adjacent pixel is unlikely to occur, and the use efficiency of light is increased.

The solid state imaging devices according to the first to third aspects of the present invention further comprise an underlying film under the color filter segments. The interstices may also be formed in the underlying film.

The solid state imaging devices according to the first to third aspects of the present invention further comprise a flattening film over the color filter segments. The interstices may also be formed in the flattening film.

In a camera which incorporates any one of the solid state imaging devices according to the first to third aspects of the present invention, color mixture is prevented. Therefore, a digital camera of high picture quality can be realized at a low cost.

In the solid state imaging devices according to the first to third aspects of the present invention, the color filter may be, for example, a color filter of primary color Bayer pattern, a color filter of primary color stripe pattern, or a complementary color filter.

According to the fourth aspect of the present invention, a method for fabricating a solid state imaging device which includes a plurality of light receiving elements arranged in a matrix configuration on a semiconductor substrate comprises the steps of: (a) forming a color filter material film above the light receiving elements; (b) forming a photosensitive resin layer on the color filter material film and selectively exposing the photosensitive resin layer to light such that a groove pattern is formed in the photosensitive resin layer; (c) etching the color filter material film using the photosensitive resin layer as a mask to form grooves in the color filter material film, thereby forming a plurality of color filter segments; and (d) forming a light collector above the plurality of color filter segments.

In the solid state imaging device fabricated by the fabrication method according to the fourth aspect of the present invention, a component of light diagonally entering a color filter in a pixel is reflected by a wall of the color filter due to a difference in refractive index between the color filter and the air, and therefore, the use efficiency of light is increased. Further, a component of light diagonally entering a color filter in a pixel is refracted at a wall of the color filter, whereby entry of the light into an adjacent light receiving element is prevented. With this structure, color mixture which would be caused by diagonal light entering from an adjacent pixel can be prevented. It is not necessary to form light-shielding black films of narrow pattern width which are required in a conventional solid state imaging device. Thus, the pixel size can be decreased.

The fabrication method according to the fourth aspect of the present invention further comprises, prior to step (a), (e) forming the light receiving elements on the semiconductor substrate and (f) forming a flattening film on the semiconductor substrate and the light receiving elements. The method further comprises, between step (c) and step (d), (g) providing a sheet of an organic material on the plurality of color filter segments. At step (d), the light collector is formed on the sheet.

According to the fifth aspect of the present invention, a method for fabricating a solid state imaging device which includes a plurality of light receiving elements arranged in a matrix configuration on a semiconductor substrate comprises the steps of: (a) forming a color filter material film above the light receiving elements; (b) forming a photosensitive resin layer on the color filter material film and selectively exposing the photosensitive resin layer to light such that a groove pattern is formed in the photosensitive resin layer; (c) etching the color filter material film using the photosensitive resin layer as a mask to form grooves in the color filter material film, thereby forming a plurality of color filter segments; (d) forming in the grooves a low refractive layer which has a refractive index lower than that of the color filter segments; and (e) forming a light collector above the color filter segments.

In the solid state imaging device fabricated by the fabrication method according to the fifth aspect of the present invention, a component of light diagonally entering a color filter in a pixel is reflected by a wall of the color filter due to a difference in refractive index between the color filter and the low refractive material, and therefore, the use efficiency of light is increased. Further, a component of light diagonally entering a color filter in a pixel is refracted at a wall of the color filter, whereby entry of the light into an adjacent light receiving element is prevented. With this structure, color mixture which would be caused by diagonal light entering from an adjacent pixel can be prevented. It is not necessary to form light-shielding black films of narrow pattern width which are required in a conventional solid state imaging device. Thus, the pixel size can be decreased.

According to the sixth aspect of the present invention, a method for fabricating a solid state imaging device which includes a plurality of light receiving elements arranged in a matrix configuration on a semiconductor substrate comprises the steps of: (a) forming a color filter material film above the light receiving elements; (b) forming a photosensitive resin layer on the color filter material film and selectively exposing the photosensitive resin layer to light such that a groove pattern is formed in the photosensitive resin layer; (c) etching the color filter material film using the photosensitive resin layer as a mask to form grooves in the color filter material film, thereby forming a plurality of color filter segments; (d) depositing an organic pigment in the grooves; and (e) forming a light collector above the plurality of color filter segments.

In the solid state imaging device fabricated by the fabrication method according to the sixth aspect of the present invention, a component of light diagonally entering a color filter in a pixel is reflected by a wall of the color filter due to a difference in refractive index between the color filter and the organic pigment material, and therefore, the use efficiency of light is increased. Further, a component of light diagonally entering a color filter in a pixel is refracted at a wall of the color filter, whereby entry of the light into an adjacent light receiving element is prevented. With this structure, color mixture which would be caused by diagonal light entering from an adjacent pixel can be prevented. It is not necessary to form light-shielding black films of narrow pattern width which are required in a conventional solid state imaging device. Thus, the pixel size can be decreased.

In the fabrication method according to the sixth aspect of the present invention, at step (d), an organic pigment of a single color is or organic pigments of multiple colors are deposited in the grooves.

The fabrication methods according to the fifth and sixth aspects of the present invention further comprise, prior to step (a), (f) forming the light receiving elements on the semiconductor substrate and (g) forming a flattening film on the semiconductor substrate and the light receiving elements. The methods further comprise, between step (d) and step (e), (h) providing a sheet of an organic material on the plurality of color filter segments. At step (e), the light collector is formed on the sheet.

According to the seventh aspect of the present invention, a method for fabricating a solid state imaging device which has a light collector comprises the steps of: (a) providing a sheet of a material over a substrate having a plurality of light receiving elements formed thereon; (b) forming on the sheet a resist layer having a shape of a lens; and (c) transferring the shape of the resist layer to the sheet by etching, thereby forming the light collector.

According to the fabrication method of the seventh aspect of the present invention, the light collection lens is formed from a material sheet. Thus, it is not necessary to dilute the material of the light collection lens with a solution into varnish as is in a conventional technique. Therefore, the stability of the material of the light collection lens is improved. Further, decrease in the refractive index due to deterioration in the electron density of the light collection lens can be prevented.

In the fabrication method according to the seventh aspect of the present invention, the refractive index of the sheet is preferably 1.6 or higher. In this case, the amount of light collected in each pixel of the solid state imaging device can be effectively increased. As a result, the sensitivity of the solid state imaging device can be improved.

In the fabrication method according to the seventh aspect of the present invention, a specific example of the high refractive sheet material is a material containing a carbodiimide group. Another example is a thermosetting resin, such as a polyimide resin, a phenol resin, or the like.

DESCRIPTION OF THE PREFERRED EMBODIMENTS

Embodiment 1

Hereinafter, a solid state imaging device according to embodiment 1 of the present invention is described. It should be noted that a CCD solid state imaging device is herein described as an example, but the present invention is not limited thereto. For example, the present invention is applicable to a MOS solid state imaging device, and the like.

Figure 1:
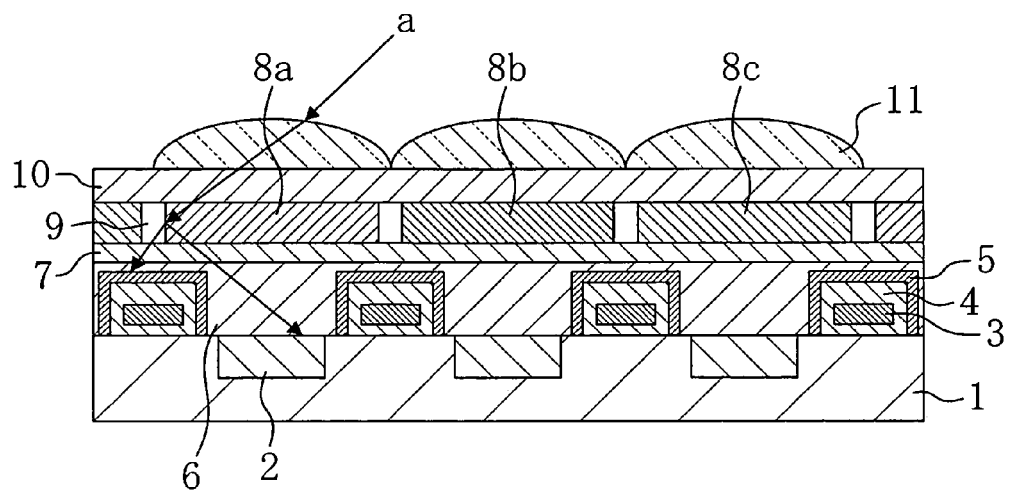
FIG. 1 is a cross-sectional view showing a structure of a solid state imaging device according to embodiment 1.

FIG. 1 is a cross-sectional view showing a structure of a solid state imaging device according to embodiment 1. As shown in FIG. 1, the solid state imaging device of embodiment 1 includes a semiconductor substrate 1, a plurality of light receiving sections 2 arranged in a matrix over the semiconductor substrate 1, transfer electrodes 3 provided on the semiconductor substrate 1 in regions between the light receiving sections 2.

The transfer electrodes 3 are provided over the semiconductor substrate 1 with the intervention of a dielectric film 4. Over the transfer electrodes 3 and the dielectric film 4 is a light shielding film 5 for hindering light from entering the transfer electrodes 3. Over the light receiving sections 2 and the light shielding film 5 is a transparent flattening film 6 for decreasing the steps formed by the light receiving sections 2 and the transfer electrodes 3 to be smaller than a predetermined level. The transparent flattening film 6 has high optical transmittance. Possible examples of the transparent flattening film 6 include inorganic films of BPSG, $SiO_2$, etc., and films of a polyimide resin, an epoxy resin, an acrylic resin, a urethane resin, a phenol resin, a silicone resin, etc.

Over the transparent flattening film 6 is a color filter underlying film 7. On the color filter underlying film 7 are color filter segments 8a, 8b and 8c. Between the color filter segments 8a, 8b and 8c are interstices 9. That is, the color filter segments 8a, 8b and 8c are separated by the interstices 9.

Over the color filter segments 8a, 8b and 8c and the interstices 9 is a flattening film 10 formed of an acrylic resin. On the flattening film 10 are microlenses 11 for collecting incident light onto the light receiving sections 2. The microlenses 1 are precisely registered with the corresponding light receiving sections 2.

For example, diagonal light a incident on the microlens 11 passes through the microlens 11 and the flattening film 10 and then passes through the color filter segment 8a. The light a is reflected or multiply reflected by the side wall of the color filter segment 8a (the interface between the color filter segment 8a and the interstice 9) and then enters the light receiving section 2 which exists under the color filter segment 8a. Thus, the use efficiency of light is improved. In the meantime, a component of the light a which is not reflected by the side wall of the color filter segment 8a hits the light shielding film 5 or any other component so as not to enter an adjacent light receiving section 2. Thus, diagonal light is unlikely to enter the light receiving section 2, and color mixture is unlikely to be caused by diagonal light.

Figure 2:
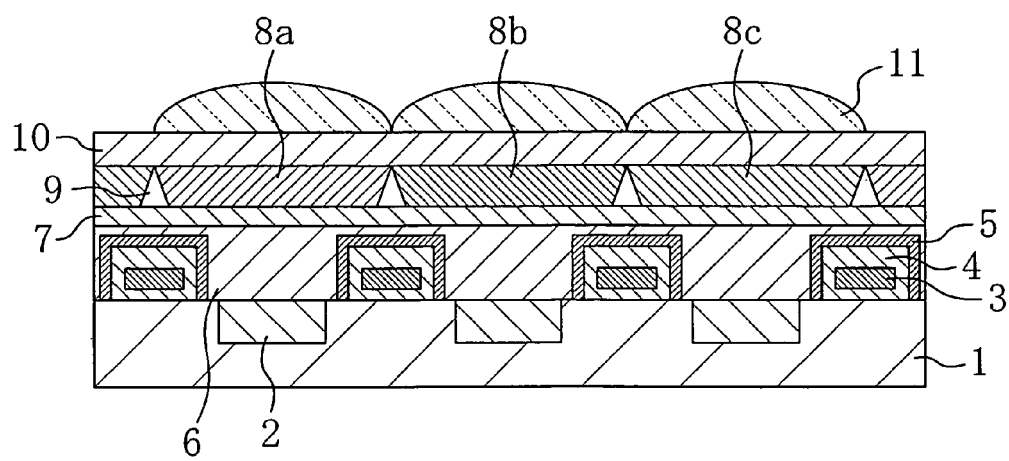
FIG. 2 is a cross-sectional view showing a structure of a variation of the solid state imaging device according to embodiment 1.

FIG. 2 is a cross-sectional view showing a structure of a variation of the solid state imaging device according to embodiment 1. The interstice 9 may have a triangular cross section which is tapered upwardly as shown in FIG. 2.

Embodiment 2

Hereinafter, a solid state imaging device according to embodiment 2 of the present invention is described. It should be noted that a CCD solid state imaging device is herein described as an example, but the present invention is not limited thereto. For example, the present invention is applicable to a MOS solid state imaging device, and the like.

Figure 3:
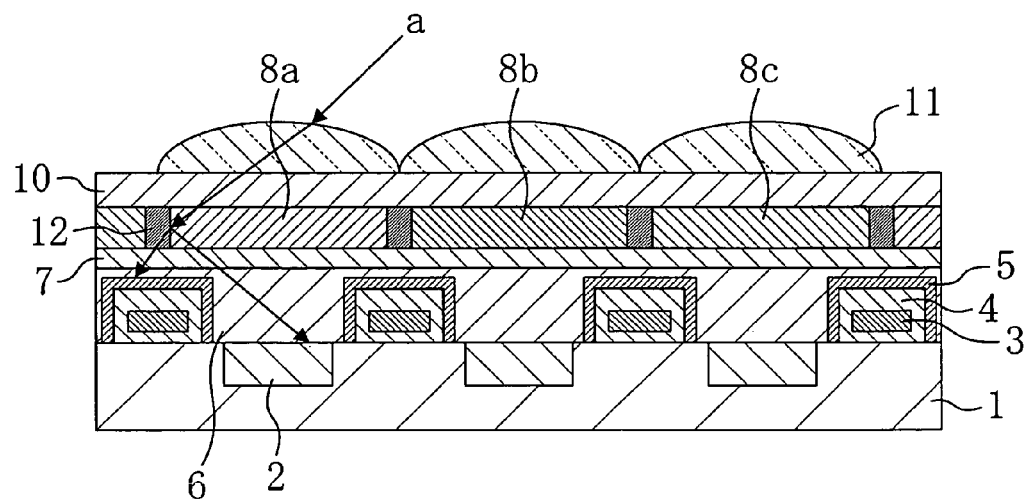
FIG. 3 is a cross-sectional view showing a structure of a solid state imaging device according to embodiment 2.

FIG. 3 is a cross-sectional view showing a structure of the solid state imaging device according to embodiment 2. As shown in FIG. 3, the solid state imaging device of embodiment 2 includes a semiconductor substrate 1, a plurality of light receiving sections 2 arranged in a matrix over the semiconductor substrate 1, transfer electrodes 3 provided on the semiconductor substrate 1 in regions between the light receiving sections 2.

The transfer electrodes 3 are provided over the semiconductor substrate 1 with the intervention of a dielectric film 4. Over the transfer electrodes 3 and the dielectric film 4 is a light shielding film 5 for hindering light from entering the transfer electrodes 3. Over the light receiving sections 2 and the light shielding film 5 is a transparent flattening film 6 for decreasing the steps formed by the light receiving sections 2 and the transfer electrodes 3 to be smaller than a predetermined level. The transparent flattening film 6 has high optical transmittance. Possible examples of the transparent flattening film 6 include inorganic films of BPSG, $SiO_2$, etc., and films of a polyimide resin, an epoxy resin, an acrylic resin, a urethane resin, a phenol resin, a silicone resin, etc.

Over the transparent flattening film 6 is a color filter underlying film 7. On the color filter underlying film 7 are color filter segments 8a, 8b and 8c. Between the color filter segments 8a, 8b and 8c are low refractive partitions 12. The refractive index of the low refractive partitions 12 is lower than that of the color filter.

Over the color filter segments 8a, 8b and 8c and the low refractive partitions 12 is a flattening film 10 formed of an acrylic resin. On the flattening film 10 are microlenses 11 for collecting incident light onto the light receiving sections 2. The microlenses 11 are precisely registered with the corresponding light receiving sections 2.

For example, diagonal light a incident on the microlens 11 passes through the microlens 11 and the flattening film 10 and then passes through the color filter segment 8a. The light a is reflected or multiply reflected by the side wall of the color filter segment 8a (the interface between the color filter segment 8a and the low refractive partition 12) and then enters the light receiving section 2 which exists under the color filter segment 8a. In the meantime, a component of the light a which is not reflected by the side wall of the color filter segment 8a hits the light shielding film 5 or any other component so as not to enter an adjacent light receiving section 2. Thus, diagonal light is unlikely to enter the light receiving section 2, and color mixture is unlikely to be caused by diagonal light.

Embodiment 3

Hereinafter, a solid state imaging device according to embodiment 3 of the present invention is described. It should be noted that a CCD solid state imaging device is herein described as an example, but the present invention is not limited thereto. For example, the present invention is applicable to a MOS solid state imaging device, and the like.

Figure 4:
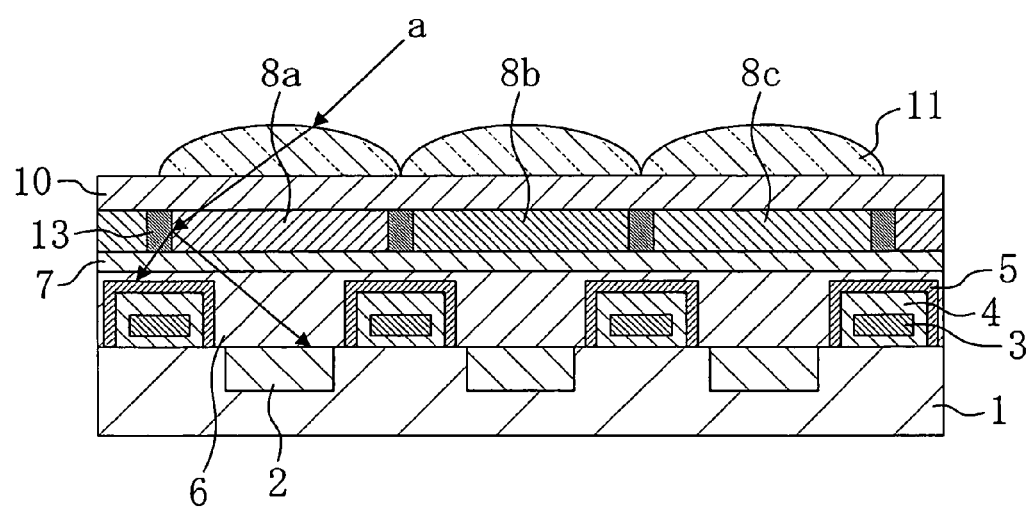
FIG. 4 is a cross-sectional view showing a structure of a solid state imaging device according to embodiment 3.

FIG. 4 is a cross-sectional view showing a structure of the solid state imaging device according to embodiment 3. As shown in FIG. 4, the solid state imaging device of embodiment 3 includes a semiconductor substrate 1, a plurality of light receiving sections 2 arranged in a matrix over the semiconductor substrate 1, transfer electrodes 3 provided on the semiconductor substrate 1 in regions between the light receiving sections 2.

The transfer electrodes 3 are provided over the semiconductor substrate 1 with the intervention of a dielectric film 4. Over the transfer electrodes 3 and the dielectric film 4 is a light shielding film 5 for hindering light from entering the transfer electrodes 3. Over the light receiving sections 2 and the light shielding film 5 is a transparent flattening film 6 for decreasing the steps formed by the light receiving sections 2 and the transfer electrodes 3 to be smaller than a predetermined level. The transparent flattening film 6 has high optical transmittance. Possible examples of the transparent flattening film 6 include inorganic films of BPSG, $SiO_2$, etc., and films of a polyimide resin, an epoxy resin, an acrylic resin, a urethane resin, a phenol resin, a silicone resin, etc.

Over the transparent flattening film 6 is a color filter underlying film 7. On the color filter underlying film 7 are color filter segments 8a, 8b and 8c. Between the color filter segments 8a, 8b and 8c are organic pigment partitions 13. The organic pigment partitions 13 are formed of a material containing an organic pigment. The organic pigment partitions 13 may have a single color or multiple colors.

Over the color filter segments 8a, 8b and 8c and the organic pigment partitions 13 is a flattening film 10 formed of an acrylic resin. On the flattening film 10 are microlenses 11 for collecting incident light onto the light receiving sections 2. The microlenses 11 are precisely registered with the corresponding light receiving sections 2.

For example, diagonal light a incident on the microlens 11 passes through the microlens 11 and the flattening film 10 and then passes through the color filter segment 8a. The light a is reflected or multiply reflected by the side wall of the color filter segment 8a (the interface between the color filter segment 8a and the organic pigment partition 13) and then enters the light receiving section 2 which exists under the color filter segment 8a. In the meantime, a component of the light a which is not reflected by the side wall of the color filter segment 8a hits the light shielding film 5 or any other component so as not to enter an adjacent light receiving section 2. Thus, diagonal light is unlikely to enter the light receiving section 2, and color mixture is unlikely to be caused by diagonal light.

Embodiment 4

Hereinafter, a solid state imaging device according to embodiment 4 of the present invention is described. It should be noted that a CCD solid state imaging device is herein described as an example, but the present invention is not limited thereto. For example, the present invention is applicable to a MOS solid state imaging device, and the like.

Figure 5:
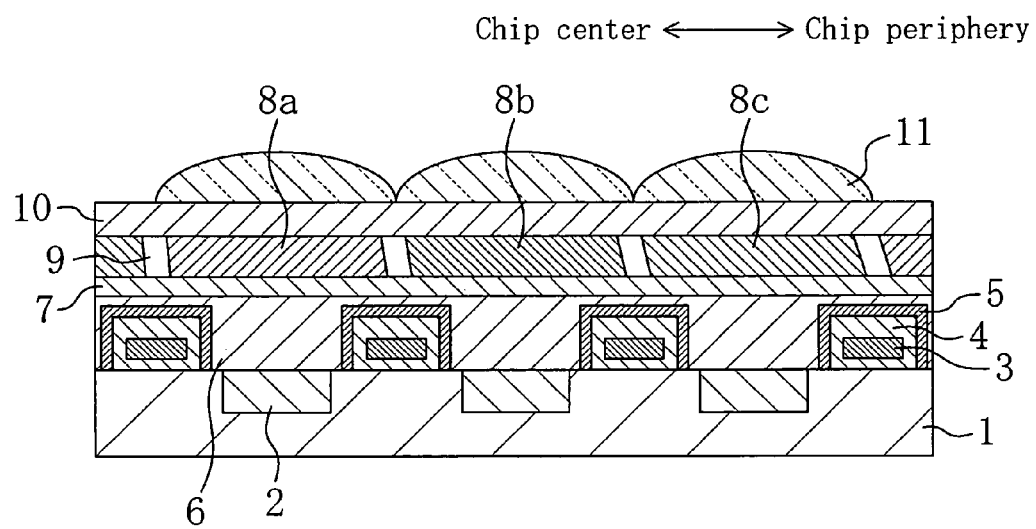
FIG. 5 is a cross-sectional view showing a structure of a solid state imaging device according to embodiment 4.

FIG. 5 is a cross-sectional view showing a structure of the solid state imaging device according to embodiment 4. As shown in FIG. 5, the solid state imaging device of embodiment 4 includes a semiconductor substrate 1, a plurality of light receiving sections 2 arranged in a matrix over the semiconductor substrate 1, transfer electrodes 3 provided on the semiconductor substrate 1 in regions between the light receiving sections 2.

The transfer electrodes 3 are provided over the semiconductor substrate 1 with the intervention of a dielectric film 4.

Over the transfer electrodes 3 and the dielectric film 4 is a light shielding film 5 for hindering light from entering the transfer electrodes 3. Over the light receiving sections 2 and the light shielding film 5 is a transparent flattening film 6 for decreasing the steps formed by the light receiving sections 2 and the transfer electrodes 3 to be smaller than a predetermined level. The transparent flattening film 6 has high optical transmittance. Possible examples of the transparent flattening film 6 include inorganic films of BPSG, $SiO_2$, etc., and films of a polyimide resin, an epoxy resin, an acrylic resin, a urethane resin, a phenol resin, a silicone resin, etc.

Over the transparent flattening film 6 is a color filter underlying film 7. On the color filter underlying film 7 are color filter segments 8a, 8b and 8c. Between the color filter segments 8a, 8b and 8c are interstices 9. In one chip, the incident angle of light incident on the color filter segments 8a, 8b and 8c increases as the position at which the light hits the color filter leaves away from the center of the chip. Therefore, at a chip periphery portion distant from the center of the chip, the centers of the microlenses 11 and the light receiving sections 2 are displaced with respect to the color filter toward the chip center. Accordingly, in the solid state imaging device according to embodiment 4, the slant angle of the side wall of a color filter segment 8 increases as the position of the color filter segment 8 leaves away from the chip center.

Over the color filter segments 8a, 8b and 8c and the interstices 9 is a flattening film 10 formed of an acrylic resin. On the flattening film 10 are microlenses 11 for collecting incident light onto the light receiving sections 2. The microlenses 11 are precisely registered with the corresponding light receiving sections 2.

In embodiment 4, displacement of light reflected by the color filter can be corrected at the chip periphery region. Thus, decrease in light amount in an image periphery region can be prevented.

Embodiment 5

Hereinafter, a solid state imaging device according to embodiment 5 of the present invention is described. It should be noted that a CCD solid state imaging device is herein described as an example, but the present invention is not limited thereto. For example, the present invention is applicable to a MOS solid state imaging device, and the like.

Figure 6:
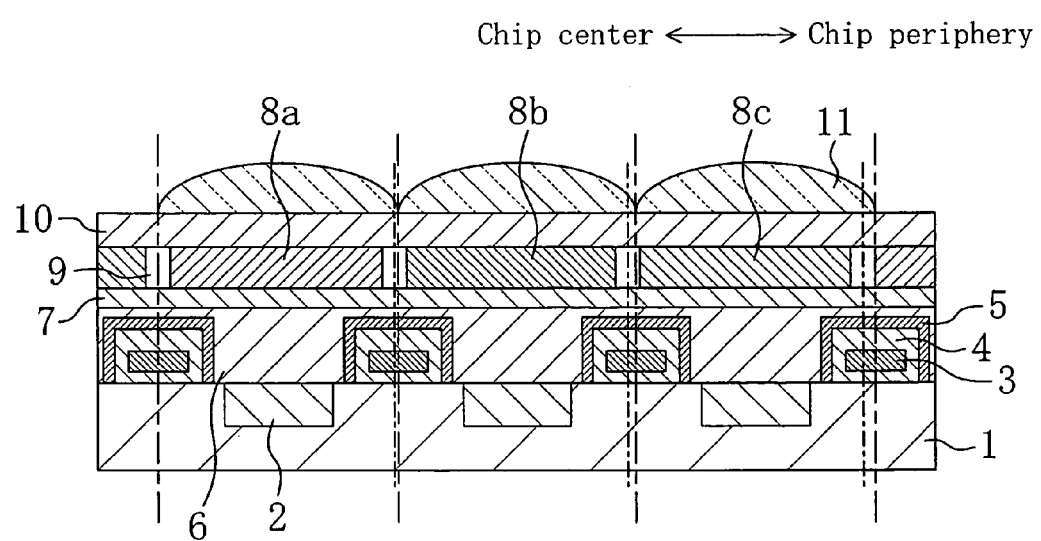
FIG. 6 is a cross-sectional view showing a structure of a solid state imaging device according to embodiment 5.

FIG. 6 is a cross-sectional view showing a structure of the solid state imaging device according to embodiment 5. As shown in FIG. 6, the solid state imaging device of embodiment 5 includes a semiconductor substrate 1, a plurality of light receiving sections 2 arranged in a matrix over the semiconductor substrate 1, transfer electrodes 3 provided on the semiconductor substrate 1 in regions between the light receiving sections 2.

The transfer electrodes 3 are provided over the semiconductor substrate 1 with the intervention of a dielectric film 4. Over the transfer electrodes 3 and the dielectric film 4 is a light shielding film 5 for hindering light from entering the transfer electrodes 3. Over the light receiving sections 2 and the light shielding film 5 is a transparent flattening film 6 for decreasing the steps formed by the light receiving sections 2 and the transfer electrodes 3 to be smaller than a predetermined level. The transparent flattening film 6 has high optical transmittance. Possible examples of the transparent flattening film 6 include inorganic films of BPSG, $SiO_2$, etc., and films of a polyimide resin, an epoxy resin, an acrylic resin, a urethane resin, a phenol resin, a silicone resin, etc.

Over the transparent flattening film 6 is a color filter underlying film 7. On the color filter underlying film 7 are color filter segments 8a, 8b and 8c. Between the color filter segments 8a, 8b and 8c are interstices 9. In one chip, the incident angle of light incident on the color filter segments 8a, 8b and 8c increases as the position at which the light hits the color filter leaves away from the center of the chip. Therefore, at a chip periphery portion distant from the center of the chip, the centers of the microlenses 11 and the light receiving sections 2 are displaced with respect to the color filter toward the chip center. According to this displacement, in the solid state imaging device according to embodiment 5, the center of each interstice 9 is also displaced with respect to the boundary between the color filter segments toward the chip center such that the displacement of the interstice 9 increases as the position of the interstice 9 leaves away from the chip center.

In embodiment 5, displacement of light reflected by the color filter can be corrected at the chip periphery region. Thus, decrease in light amount in an image periphery region can be prevented.

Embodiment 6

Figure 7:
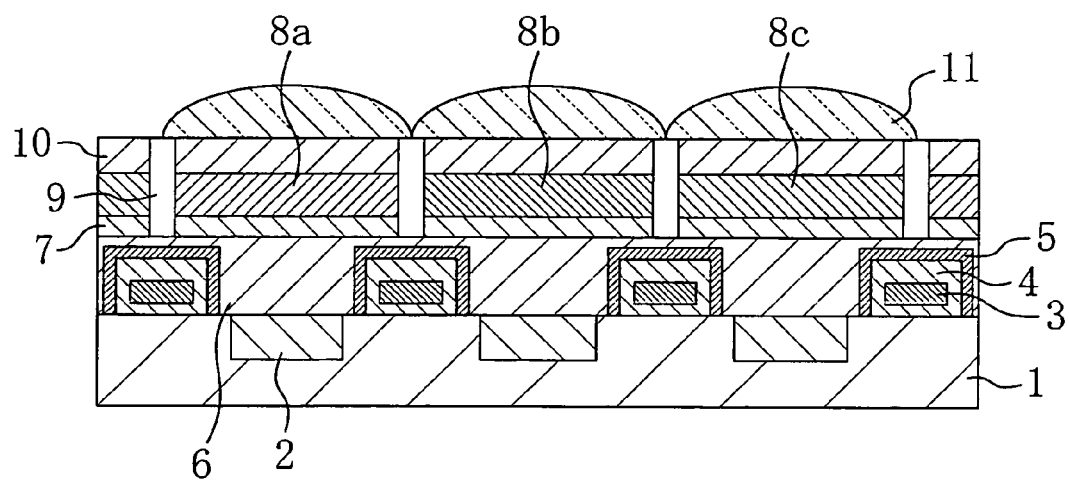
FIG. 7 is a cross-sectional view showing a structure of a solid state imaging device according to embodiment 6.

Hereinafter, a solid state imaging device according to embodiment 6 of the present invention is described. FIG. 7 is a cross-sectional view showing a structure of the solid state imaging device according to embodiment 6.

As shown in FIG. 7, in the solid state imaging device of embodiment 6, interstices 9 are formed not only between the color filter segments 8a, 8b and 8c but also in the flattening film 10 and the color filter underlying film 7. The other features are the same as those described in embodiment 1, and therefore, the descriptions thereof are herein omitted.

In the structure of embodiment 6, a space in which the interstices 9 are formed are larger, and accordingly, a larger amount of light can be reflected. Thus, the light enters the light receiving sections 2 more assuredly.

In the example of FIG. 7, the interstices 9 in the structure of FIG. 1 are also formed in the flattening film 10 and the color filter underlying film 7. However, the interstices 9 in the structures of FIG. 2 to FIG. 6 may also formed in the flattening film 10 and the color filter underlying film 7. Specifically, in the structure of FIG. 2, the interstices 9 each having a triangular cross section may be formed in the flattening film 10 and the color filter underlying film 7. In the structure of FIG. 3, the low refractive partitions 12 may be formed in the flattening film 10 and the color filter underlying film 7. In the structure of FIG. 4, the organic pigment partition 13 may be formed in the flattening film 10 and the color filter underlying film 7. In the structure of FIG. 5, the interstices 9 may also be formed in the flattening film 10 and the color filter underlying film 7 such that the flattening film 10 and the color filter underlying film 7 have slanted side walls at the interstices 9. In the structure of FIG. 6, the interstices 9 may also be formed in the flattening film 10 and the color filter underlying film 7.

Embodiment 7

Hereinafter, a method for fabricating a solid state imaging device according to embodiment 7 of the present invention is described. It should be noted that a method for fabricating a CCD solid state imaging device is herein described as an example, but the present invention is not limited thereto. For example, the present invention is applicable to a method for fabricating a MOS solid state imaging device, and the like.

FIG. 8A to FIG. 11B are cross-sectional views illustrating fabrication steps of a solid state imaging device according to embodiment 7. It should be noted that the fabrication method of embodiment 7 is a method for fabricating the solid state imaging device of embodiment 1.

According to the solid state imaging device fabrication method of embodiment 7, at the first step, a plurality of light receiving sections 2 are formed in a matrix configuration over a semiconductor substrate 1. Then, transfer electrodes 3 and dielectric films 4 which envelope the transfer electrodes 3 are formed on the semiconductor substrate 1 in regions between the light receiving sections 2. Thereafter, a light shielding film 5 is formed over the transfer electrodes 3 for hindering light from entering the transfer electrodes 3. Then, a transparent flattening film 6 is formed over the resultant structure for decreasing the steps formed by the light receiving sections 2 and the transfer electrodes 3 to be smaller than a predetermined level. The transparent flattening film 6 may be formed of a material having high optical transmittance, for example, an inorganic material, such as BPSG, $SiO_2$, or the like, or a polyimide resin, an epoxy resin, an acrylic resin, a urethane resin, a phenol resin, a silicone resin, or the like. When a resin is used for the transparent flattening film 6, for example, the resin is applied over the substrate so as to have a thickness of 0.5 to 5 μm and then thermally cured at 180 to 250° C. for 2 to 5 min.

Figure 8A:
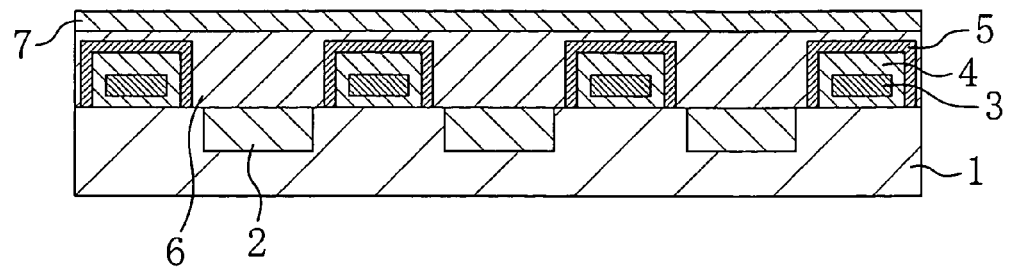
FIGS. 8A, 8B and 8C are cross-sectional views illustrating fabrication steps of a solid state imaging device according to embodiment 7.

Then, a transparent resin is applied over the transparent flattening film 6 and thermally cured at 180 to 250° C. for 2 to 5 min to form a color filter underlying film 7 having a thickness of 0.05 μm to 0.3 μm, resulting in the structure shown in FIG. 8A. The material of the color filter underlying film 7 is a transparent resin which has high optical transmittance and excellent adhesion to color filter segments 8a, 8b and 8c which are to be formed thereon (see FIG. 8B) and from which development residue is not generated.

Then, a negative-type pigment resist is applied over the color filter underlying film 7. This application is carried out with a resist of 3 to 5 cc which is supplied for 30 seconds with a spinner whose main rotation is 1500 rpm to 3000 rpm. After the application of the resist, the resist layer is prebaked at 80° C. to 100° C. for 30 to 80 seconds. Thereafter, the resultant structure is selectively exposed to ultraviolet light (i ray) using a photomask. The resist layer is then developed using an aqueous alkaline developer solution and then subjected to post-baking at 180° C. to 250° C. for 2 to 5 min, whereby the resist is thermally cured. As a result, a first color filter segment 8a is formed. In the same way, a second color filter segment 8b and a third color filter segment 8c are formed, resulting in the structure shown in FIG. 8B.

Then, a positive-type photosensitive resin is applied over the color filter segments 8a, 8b and 8c so as to have a thickness of 1.0 to 5.0 μm. This application is carried out with the resist being supplied for 30 seconds with a spinner whose main rotation is 1500 rpm to 3000 rpm. After the application of the resist, the resist layer is prebaked at 80° C. to 100° C. for 30 to 80 seconds. Thereafter, the resultant structure is selectively exposed to ultraviolet light (i ray) using a photomask. The resist layer is then developed using an aqueous alkaline developer solution to form a pattern 14 which has openings at the boundaries of the color filter segments 8a, 8b and 8c. Thereafter, dry etching is carried out over the pattern 14 with a mixed gas of $CF_4$ and $O_2$, or the like, as shown in FIG. 8C such that interstices 9 are formed between the color filter segments 8a, 8b and 8c.

Figure 9A:
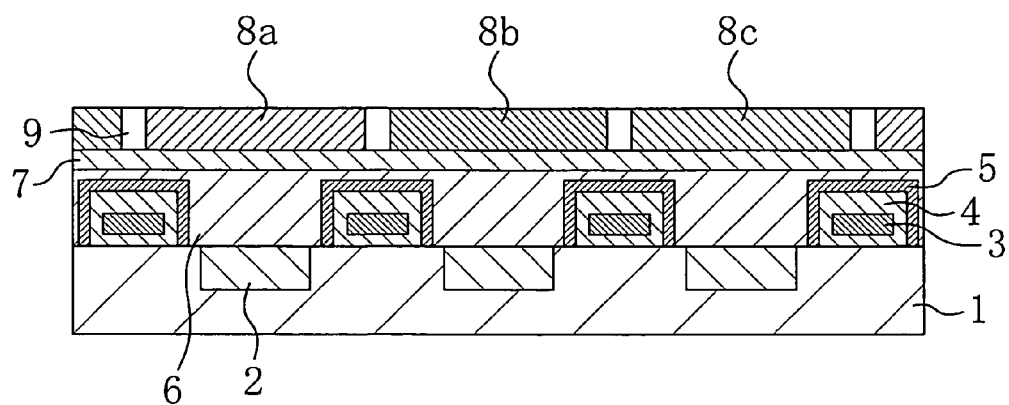
FIGS. 9A and 9B are cross-sectional views illustrating fabrication steps of a solid state imaging device according to embodiment 7.

Thereafter, the pattern 14 is removed from the color filter segments 8a, 8b and 8c using a solution, such as methylbutylketone, or the like, resulting in the structure shown in FIG. 9A.

Figure 9B:
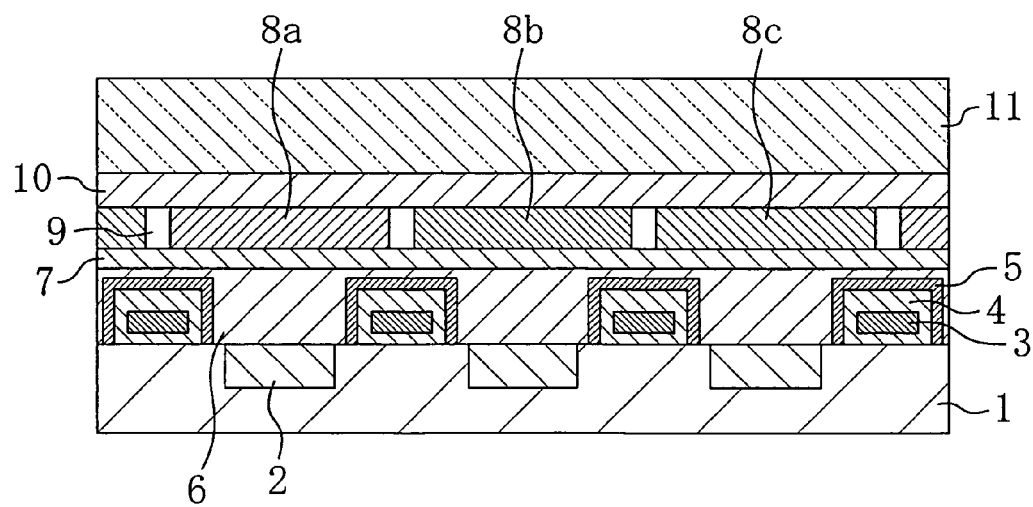

Then, a flattening film 10 is formed over the color filter segments 8a, 8b and 8c, and a high refractive sheet having a thickness of 0.5 μm to 2.0 μm is placed over the flattening film 10. The high refractive sheet is thermally cured at 180° C. to 250° C. for 2 to 5 minutes, whereby a microlens layer 11 is formed as shown in FIG. 9B. The high-refractive sheet may be a sheet that contains a carbodiimide group or may be a thermosetting sheet of a polyimide resin, a phenol resin, or the like.

Then, a novolac resin is supplied for 30 minutes with a spinner whose main rotation is 1500 to 3000 rpm to be applied over the entire surface of the wafer. Thereafter, the resultant structure is prebaked at 80° C. to 100° C. for 30 to 80 seconds, whereby a lens template layer 15 having a thickness of 0.5 μm to 2.0 μm is formed. Then, the lens template layer 15 is selectively exposed to ultraviolet light (i ray) through a photomask 16 as shown in FIG. 1A.

Figure 10A:
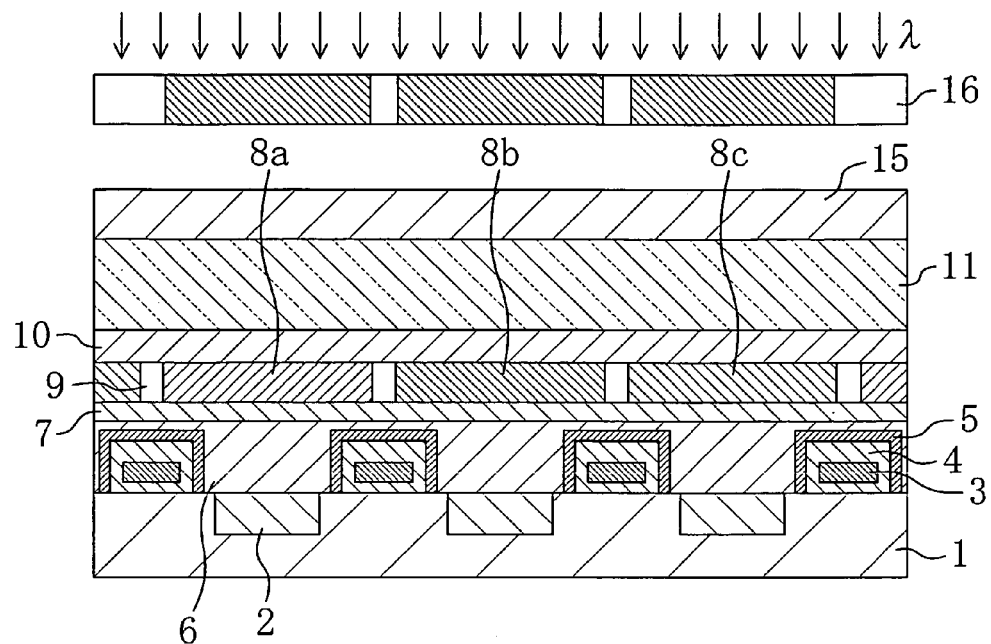
FIGS. 10A and 10B are cross-sectional views illustrating fabrication steps of a solid state imaging device according to embodiment 7.
Figure 10B:
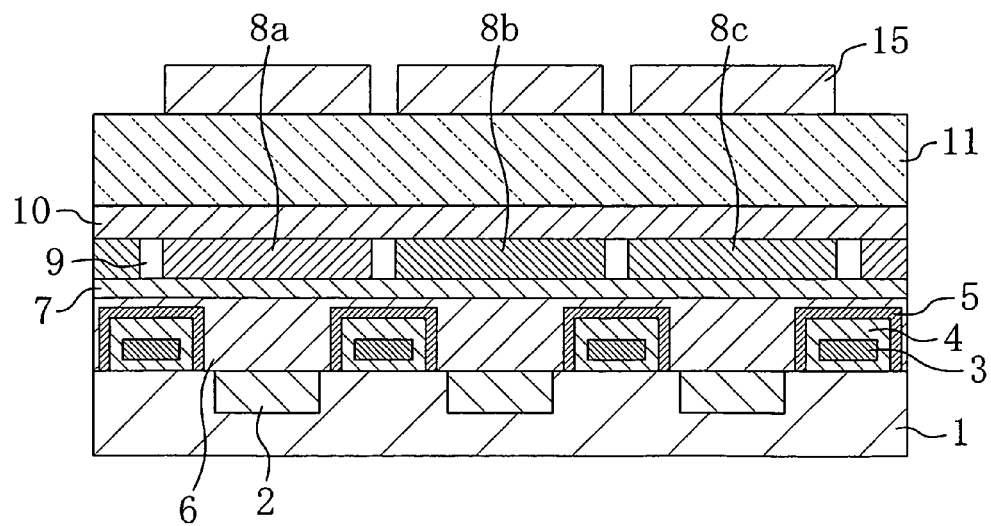

Then, the lens template layer 15 is developed using an aqueous alkaline developer solution to form a pattern in the lens template layer 15 as shown in FIG. 10B.

Figure 11A:
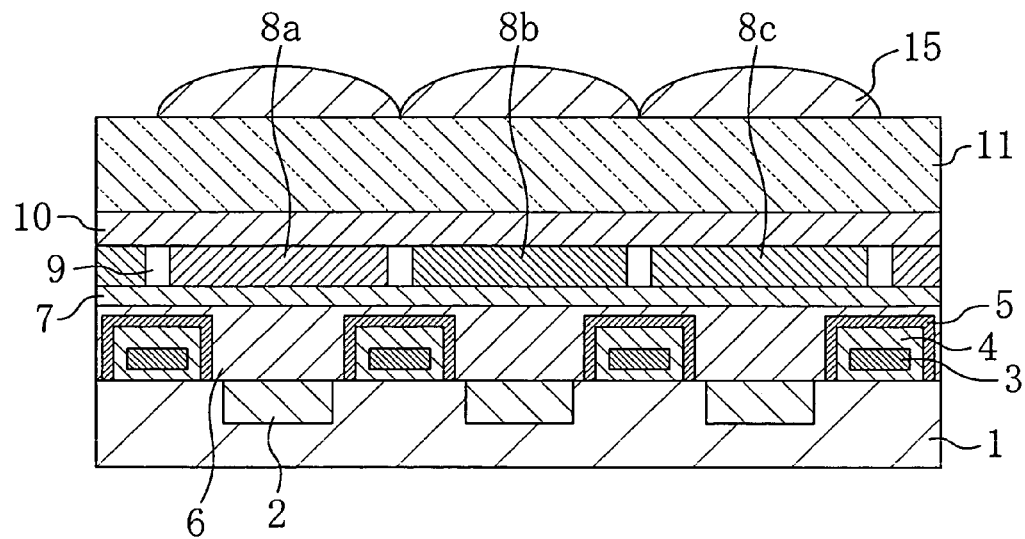
FIGS. 11A and 11B are cross-sectional views illustrating fabrication steps of a solid state imaging device according to embodiment 7.

Then, the resultant structure is baked at 135° C. to 200° C. for 2 to 5 minutes, whereby the surface of the lens template layer 15 is shaped into a curved surface of a convex lens by utilizing the surface tension of the novolac resin as shown in FIG. 11A.

Figure 11B:
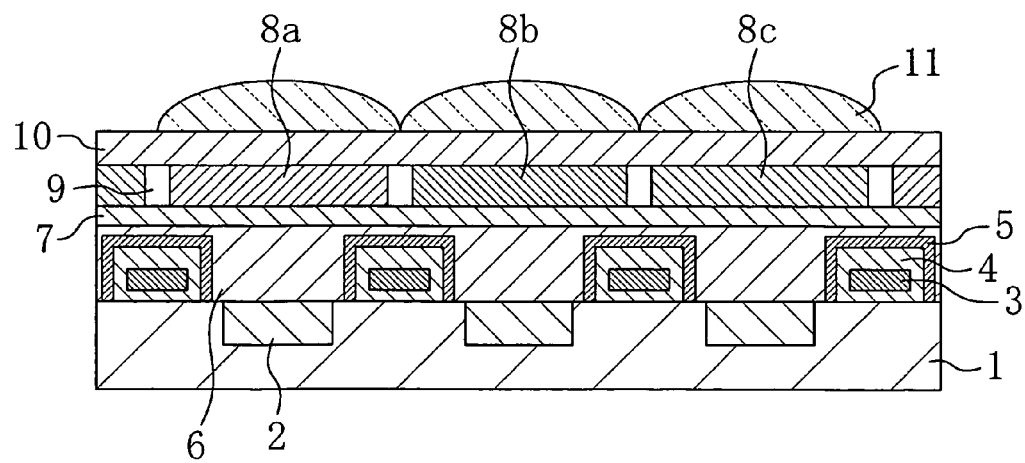

Thereafter, the shape of the lens template layer 15 is transferred to the microlens layer 11 by dry etching as shown in FIG. 11B. This dry etching is carried out using, for example, a mixed gas of $CF_4$ and $O_2$ under a condition that the etching speed for the lens template layer 15 and the etching speed for the microlens layer 11 are substantially the same. In this dry etching process, a material containing carbon and fluorine is deposited at the sides of the microlens layer 11, such that the lens gap of the resultant microlenses 11 is smaller than that of the lens template segments 15.

In a solid state imaging device fabricated according to the fabrication method of embodiment 7, for example, referring to FIG. 1, diagonal light a incident on the microlens 11 passes through the microlens 11 and the flattening film 10 and then passes through the color filter segment 8a. The light a is reflected or multiply reflected by the side wall of the color filter segment 8a (the interface between the color filter segment 8a and the interstice 9) and then enters the light receiving section 2 which exists under the color filter segment 8a. In the meantime, a component of the light a which is not reflected by the side wall of the color filter segment 8a hits the light shielding film 5 or any other component so as not to enter an adjacent light receiving section 2. Thus, diagonal light is unlikely to enter the light receiving section 2, and color mixture is unlikely to be caused by diagonal light.

Further, the area of microlenses can be maximized without increasing the cell size.

Embodiment 8

Hereinafter, a method for fabricating a solid state imaging device according to embodiment 8 of the present invention is described. It should be noted that a method for fabricating a CCD solid state imaging device is herein described as an example, but the present invention is not limited thereto. For example, the present invention is applicable to a method for fabricating a MOS solid state imaging device, and the like.

Figure 12A:
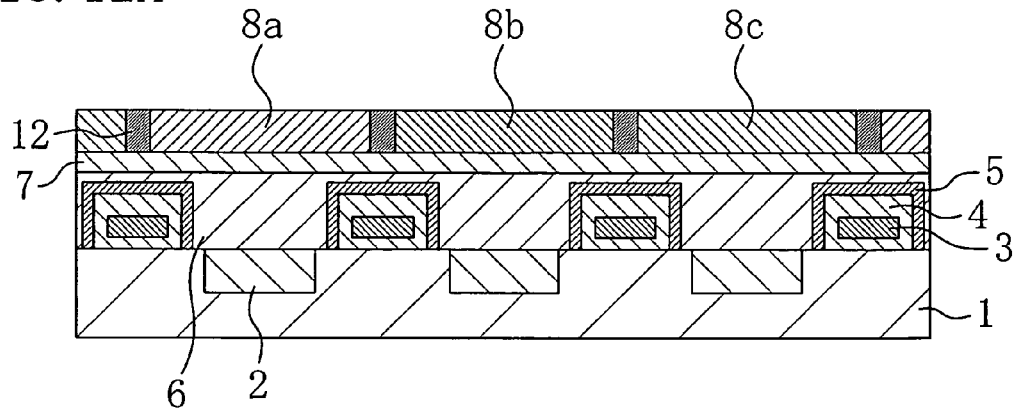
FIGS. 12A, 12B and 12C are cross-sectional views illustrating fabrication steps of a solid state imaging device according to embodiment 8.
Figure 12B:
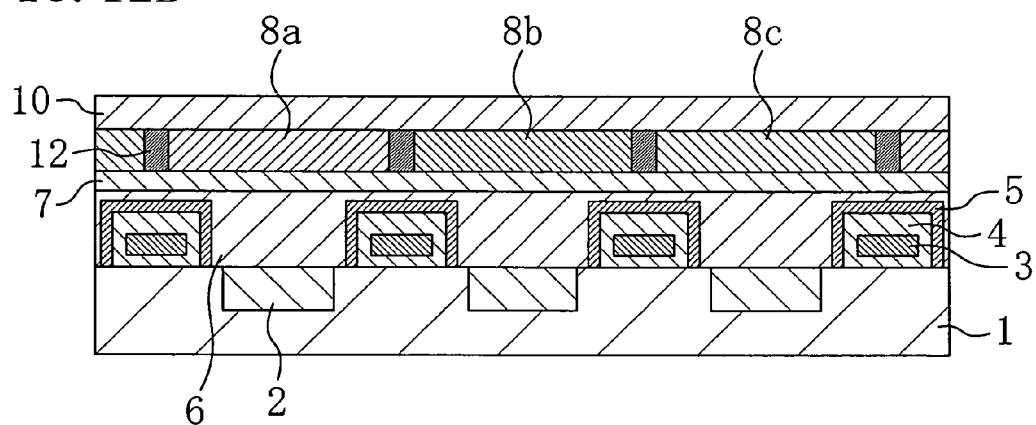
Figure 12C:
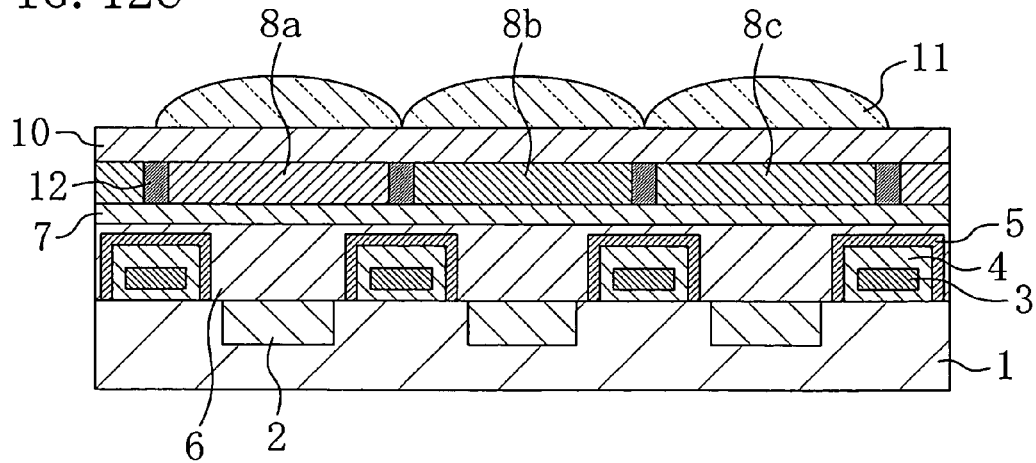

FIG. 12A to FIG. 12C are cross-sectional views illustrating fabrication steps of a solid state imaging device according to embodiment 8. It should be noted that the fabrication method of embodiment 8 is a method for fabricating the solid state imaging device of embodiment 2.

Figure 8B:
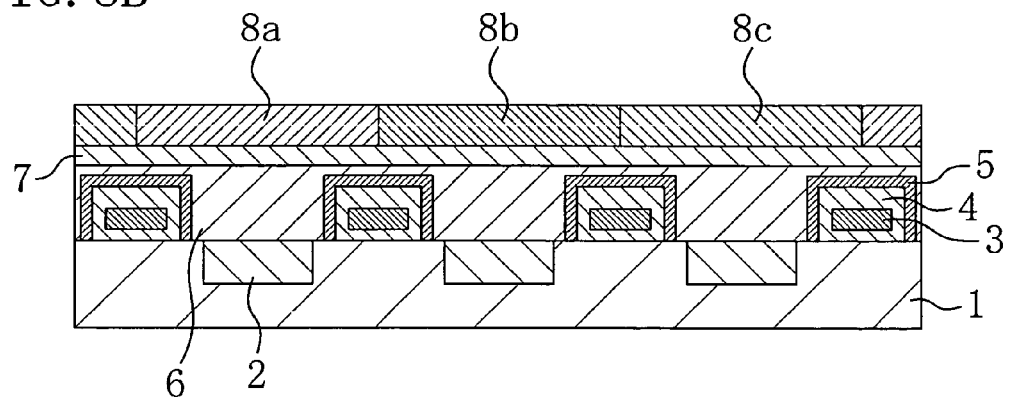
Figure 8C:
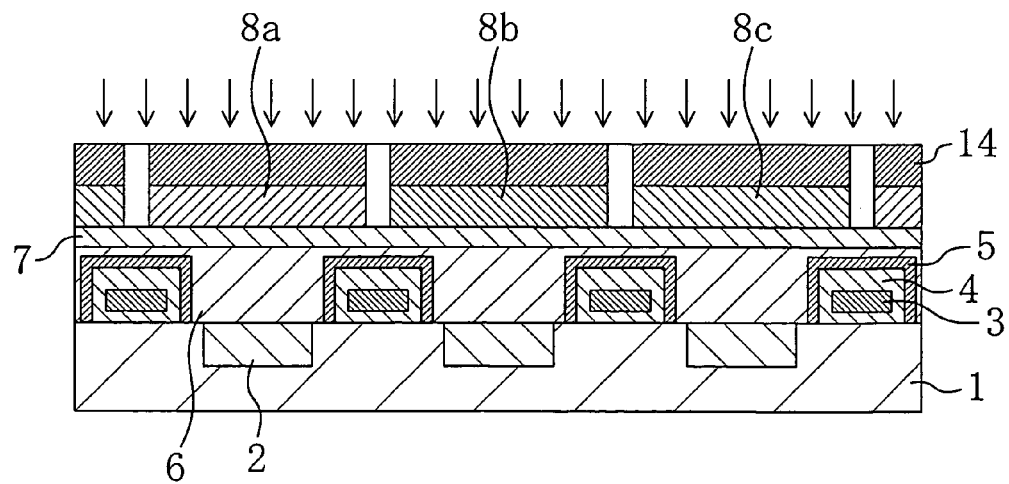

In the solid state imaging device fabrication method of embodiment 8, the steps of FIG. 8A to FIG. 8C which have been described in embodiment 7 are first performed. After the interstices 9 have been formed between the color filter segments 8a, 8b and 8c at the step of FIG. 8C, low refractive partitions 12 of a fluorine resin are formed in the interstices 9 by a spin coat method and thermally cured, resulting in the structure shown in FIG. 12A.

Then, an acrylic resin is applied over the color filter segments 8a, 8b and 8c and the low refractive partitions 12 and thermally cured to form a flattening film 10 as shown in FIG. 12B.

Then, a novolac resin, a polyimide resin, or an acrylic resin is supplied for 30 minutes with a spinner whose main rotation is 1500 to 3000 rpm to be applied over the entire surface of the wafer. Thereafter, the resultant structure is prebaked at 80° C. to 100° C. for 30 to 80 seconds. Then, the resin layer is selectively exposed to ultraviolet light (i ray) through a photomask 16. After the exposure, the resist layer is developed using an aqueous alkaline developer solution and then baked at 135° C. to 200° C. for 2 to 5 minutes. As a result, microlenses 11 each having a curved surface of a convex lens are formed as shown in FIG. 12C by utilizing the surface tension of the novolac resin, a polyimide resin, or an acrylic resin.

In a solid state imaging device fabricated according to the fabrication method of embodiment 8, for example, referring to FIG. 3, diagonal light a incident on the microlens 11 passes through the microlens 11 and the flattening film 10 and then passes through the color filter segment 8a. The light a is reflected or multiply reflected by the side wall of the color filter segment 8a (the interface between the color filter segment 8a and the low refractive partition 12) and then enters the light receiving section 2 which exists under the color filter segment 8a. In the meantime, a component of the light a which is not reflected by the side wall of the color filter segment 8a hits the light shielding film 5 or any other component so as not to enter an adjacent light receiving section 2. Thus, diagonal light is unlikely to enter the light receiving section 2, and color mixture is unlikely to be caused by diagonal light.

Further, the area of microlenses can be maximized without increasing the cell size.

The microlenses may be formed by dry etching as described in embodiment 7.

Although in embodiment 8 the low refractive partitions 12 are formed after the formation of the interstices 9, organic pigment partitions may be formed instead by vapor deposition according to the present invention.

Embodiment 9

Hereinafter, a method for fabricating a solid state imaging device according to embodiment 9 of the present invention is described. It should be noted that a method for fabricating a CCD solid state imaging device is herein described as an example, but the present invention is not limited thereto. For example, the present invention is applicable to a method for fabricating a MOS solid state imaging device, and the like.

FIG. 13A to FIG. 14B are cross-sectional views illustrating fabrication steps of a solid state imaging device according to embodiment 9. It should be noted that the fabrication method of embodiment 9 is a method for fabricating the solid state imaging device shown in FIG. 2.

Figure 13A:
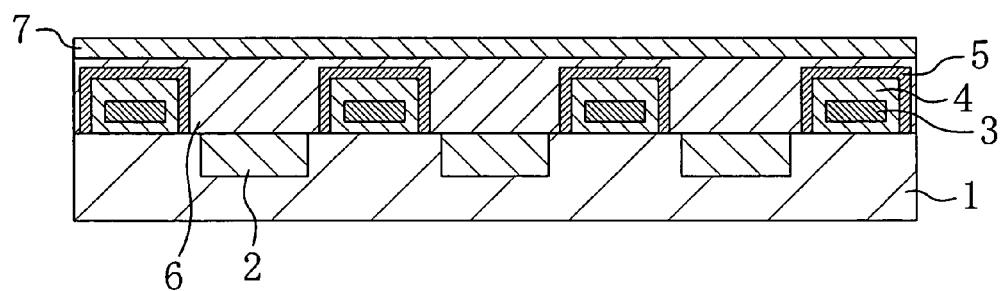
FIGS. 13A and 13B are cross-sectional views illustrating fabrication steps of a solid state imaging device according to embodiment 9.
Figure 13B:
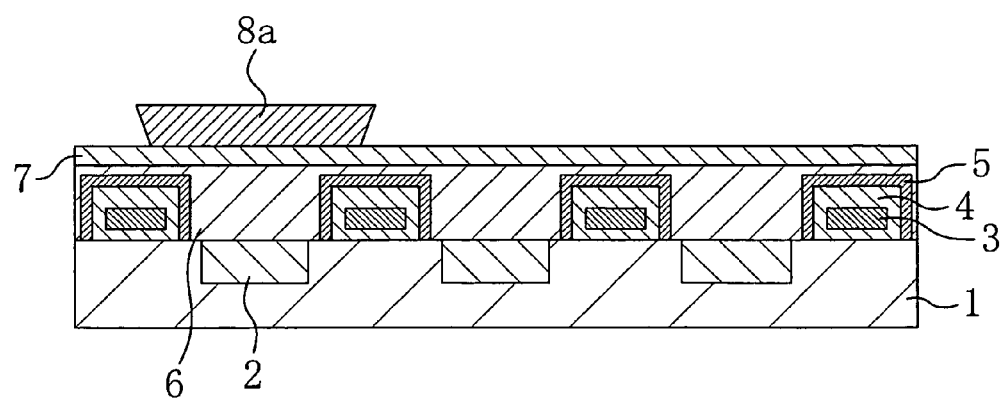

In the solid state imaging device fabrication method of embodiment 9, the fabrication step which has been described in connection with FIG. 8A is first performed, resulting in the structure shown in FIG. 13A.

Then, a negative-type pigment resist is applied over the resultant structure. This application is carried out with a resist of 3 to 5 cc which is supplied for 30 seconds with a spinner whose main rotation is 1500 rpm to 3000 rpm. After the application of the resist, the resist layer is prebaked at 80° C. to 100° C. for 30 to 80 seconds. Thereafter, the resultant structure is selectively exposed to ultraviolet light (i ray) using a photomask. Then, the resist layer is developed using an aqueous alkaline developer solution and thermally cured at 180° C. to 250° C. for 2 to 5 min, whereby a first color filter segment 8a is formed. In the exposure process, focusing of the light is defocused such that the first color filter segment 8a has an inversely tapered shape.

Figure 14A:
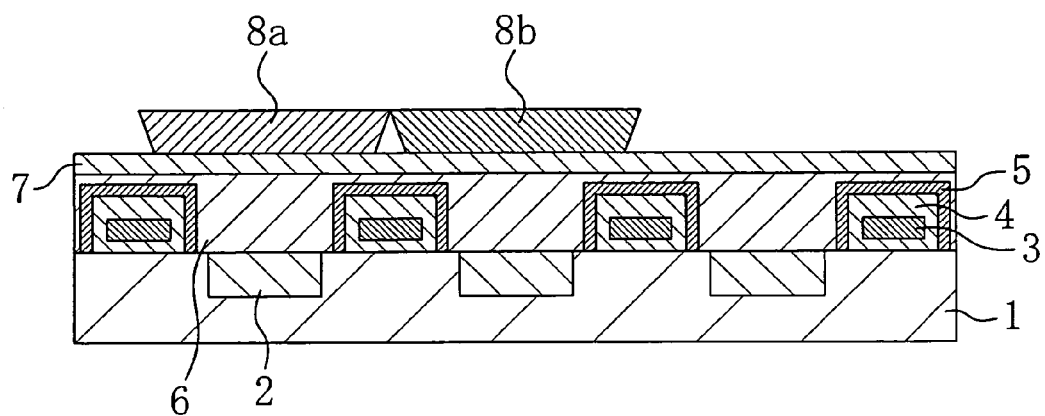
FIGS. 14A and 14B are cross-sectional views illustrating fabrication steps of a solid state imaging device according to embodiment 9.
Figure 14B:
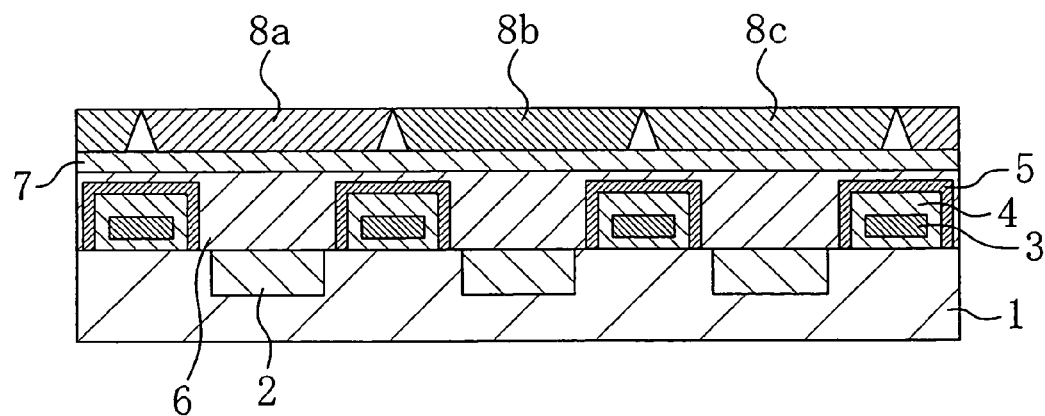

With the same conditions as those given for the formation of the first color filter segment 8a, a second color filter segment 8b is formed as shown in FIG. 14A, and then, a third color filter segment 8c is formed as shown in FIG. 14B.

In a solid state imaging device fabricated according to the fabrication method of embodiment 9, for example, diagonal light incident on the microlens 11 passes through the microlens 11 and the flattening film 10 and then passes through the color filter segment 8b. The light is reflected or multiply reflected by the side wall of the color filter segment 8b (the interface between the color filter segment 8b and the low refractive partition 12) and then enters the light receiving section 2 which exists under the color filter segment 8b. In the meantime, a component of the light which is not reflected by the side wall of the color filter segment 8b hits the light shielding film 5 or any other component so as not to enter an adjacent light receiving section 2. Thus, diagonal light is unlikely to enter the light receiving section 2, and color mixture is unlikely to be caused by diagonal light.

Further, the area of microlenses can be maximized without increasing the cell size.

Embodiment 10

Hereinafter, a method for fabricating a solid state imaging device according to embodiment 10 of the present invention is described. It should be noted that a method for fabricating a CCD solid state imaging device is herein described as an example, but the present invention is not limited thereto. For example, the present invention is applicable to a method for fabricating a MOS solid state imaging device, and the like.

FIG. 15A to FIG. 17B are cross-sectional views illustrating fabrication steps of a solid state imaging device according to embodiment 10 of the present invention.

According to the solid state imaging device fabrication method of embodiment 10, at the first step, a plurality of light receiving sections 2 are formed in a matrix configuration over a semiconductor substrate 1. Then, transfer electrodes 3, which are provided on the semiconductor substrate 1 in regions between the light receiving sections 2, a dielectric film 4, which intervenes between the semiconductor substrate 1 and the transfer electrode 3 and covers the transfer electrode 3, a light shielding film 5, which covers the upper and side surfaces of the dielectric film 4 for hindering light from entering the transfer electrodes 3, and a transparent flattening film 6, which is provided for decreasing the steps formed by the light receiving sections 2 and the transfer electrodes 3 to be smaller than a predetermined level, are formed. The transparent flattening film 6 may be formed of a material having high optical transmittance, for example, an inorganic material, such as BPSG, $SiO_2$, or the like, or a polyimide resin, an epoxy resin, an acrylic resin, a urethane resin, a phenol resin, a silicone resin, or the like. When a resin is used for the transparent flattening film 6, for example, the resin may be applied over the substrate and then thermally cured. This thermal treatment may be performed at 180 to 250° C. for 2 to 5 min. The thickness of the resin film is preferably about 0.5 to 5 μm.

Figure 15A:
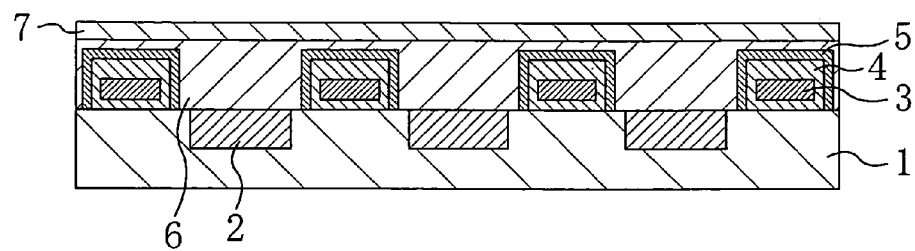
FIGS. 15A, 15B and 15C are cross-sectional views illustrating fabrication steps of a solid state imaging device according to embodiment 10.
Figure 15B:
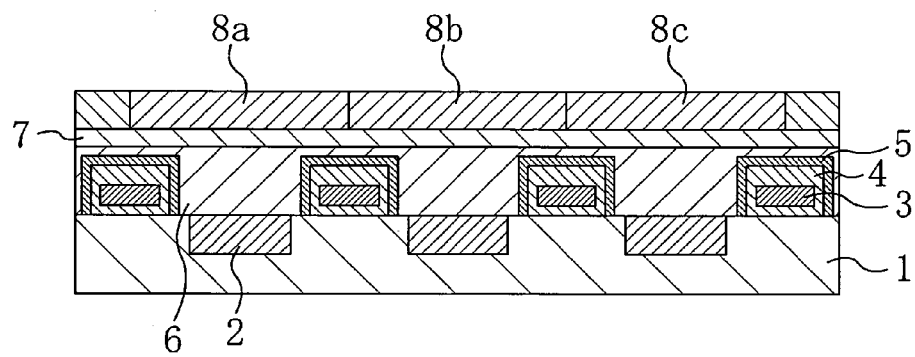

Then, a transparent resin is applied over the transparent flattening film 6 so as to have a thickness of 0.05 μm to 0.3 μm and heated in the temperature range of 180 to 250° C. for 2 to 5 min to form a color filter underlying film 7, resulting in the structure shown in FIG. 15A. Preferably, the material of the color filter underlying film 7 is a transparent resin which has high optical transmittance and excellent adhesion to a color filter (which will be formed later (see FIG. 15B)) and from which development residue is unlikely to be generated.

Then, a negative-type pigment resist is applied over the color filter underlying film 7. This application is carried out with a solution of 3 to 5 cc per second which is supplied for 30 seconds without an interruption with a spinner whose main rotation is 1500 rpm to 3000 rpm. After the application of the negative-type pigment resist, the resist layer is prebaked at 80° C. to 100° C. for 30 to 80 seconds. After the prebaking step, the resultant structure is selectively exposed to ultraviolet light (i ray) through a photomask. The resist layer is then developed using an aqueous alkaline developer solution and then subjected to post-baking at 180° C. to 250° C. for 2 to 5 min, whereby the resist is thermally cured. As a result, a first color filter segment 8a is formed. The first color filter segment 8a is formed above any of the light receiving sections 2. In the same way, a second color filter segment 8b and a third color filter segment 8c are formed above the light receiving sections 2, resulting in the structure shown in FIG. 15B.

Figure 15C:
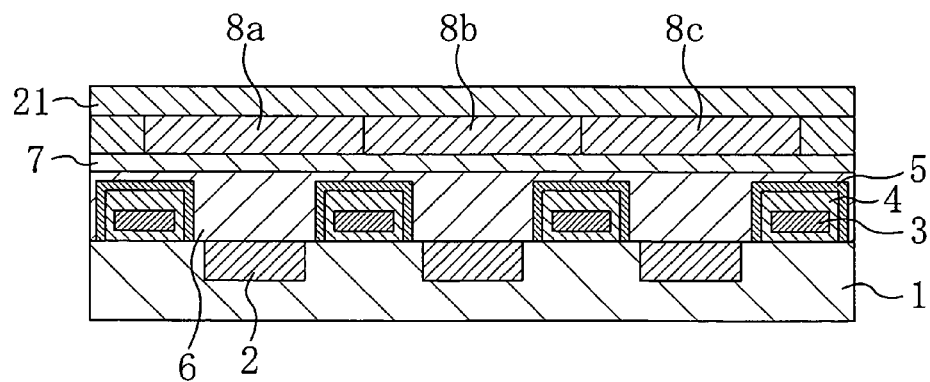

Then, in order to decrease the steps formed between the first color filter segment 8a, the second color filter segment 8b and the third color filter segment 8c, an acrylic resin is applied over the color filter segments 8a, 8b and 8c. The resultant structure is prebaked at 80° C. to 100° C. for 30 to 80 seconds and is thereafter subjected to post-baking at 180° C. to 250° C. for 2 to 5 min, whereby the acrylic resin is thermally cured to form a transparent flattening film 21 as shown in FIG. 15C.

Figure 16A:
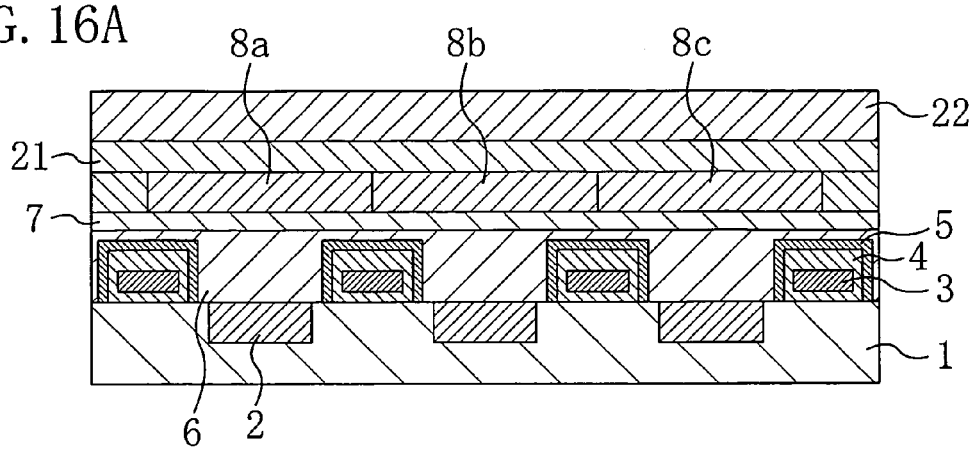
FIGS. 16A, 16B and 16C are cross-sectional views illustrating fabrication steps of a solid state imaging device according to embodiment 10.

Then, a high refractive sheet containing a carbodiimide group which has a thickness of 0.5 μm to 2.0 μm is placed over the entire wafer. The high refractive sheet is thermally treated at 180° C. to 250° C. for 2 to 5 minutes, whereby the sheet is cured to form a lens layer 22 as shown in FIG. 16A. It should be noted that the high refractive sheet may be a thermosetting sheet of a polyimide resin, a phenol resin, or the like, in place of the sheet that contains a carbodiimide group. Preferably, the refractive index of the high refractive sheet is 1.6 or higher.

Then, a novolac resin, or the like, is supplied for 30 minutes with a spinner whose main rotation is 1500 to 3000 rpm to be applied over the entire surface of the wafer, whereby a resist film is formed. Thereafter, the resultant structure is prebaked at 80° C. to 100° C. for 30 to 80 seconds, whereby a lens template layer 23 having a thickness of 0.5 μm to 2.0 μm is formed.

Figure 16B:
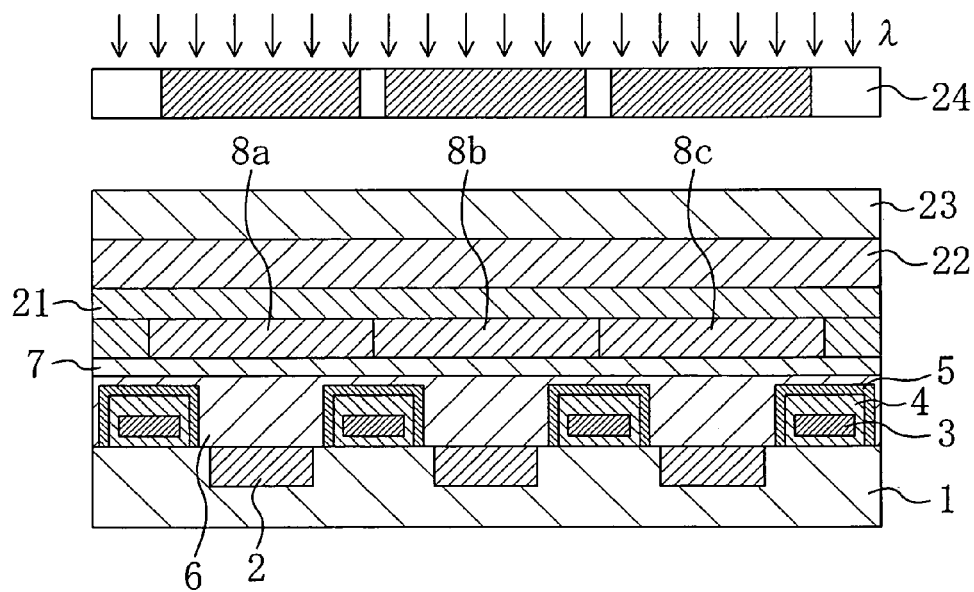

Then, the lens template layer 23 is selectively exposed to ultraviolet light (i ray) through a photomask 24 as shown in FIG. 16B.

Figure 16C:
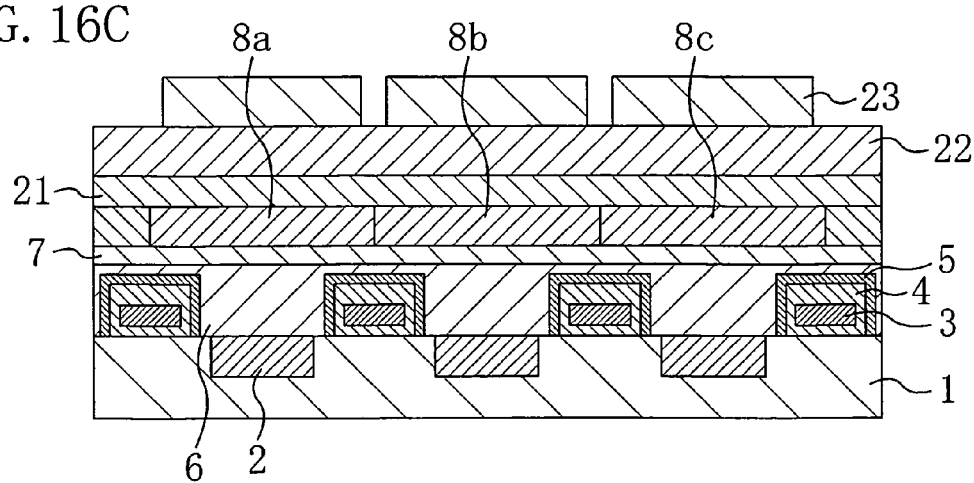

After the exposure step, the lens template layer 23 is developed using an aqueous alkaline developer solution such that unnecessary portions of the lens template layer 23 are removed, whereby the lens template layer 23 is separated into a plurality of segments as shown in FIG. 16C.

Figure 17A:
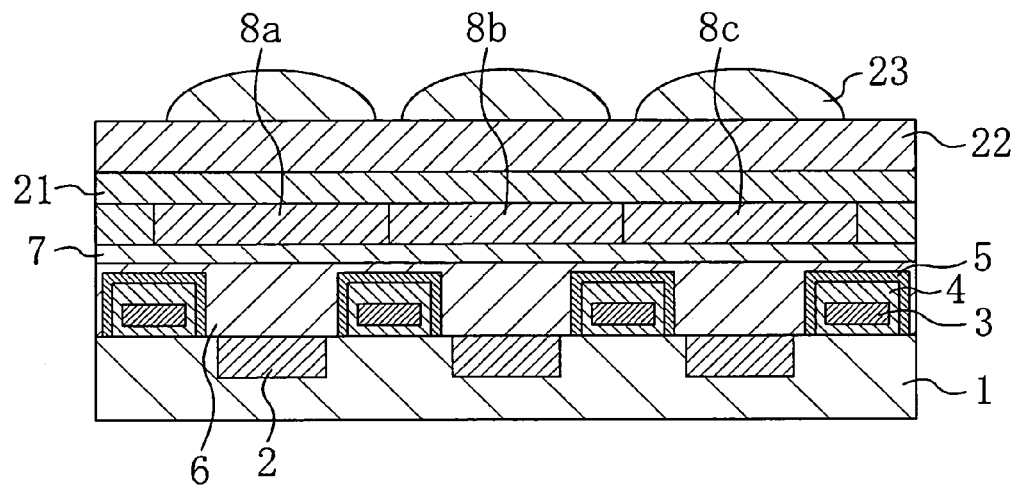
FIGS. 17A and 17B are cross-sectional views illustrating fabrication steps of a solid state imaging device according to embodiment 10.

Thereafter, the resultant structure is baked at 135° C. to 200° C. for 2 to 5 minutes. Through this baking process, the surface of the lens template layer 23 is shaped into a curved surface of a convex lens due to the surface tension of the novolac resin as shown in FIG. 17A.

Figure 17B:
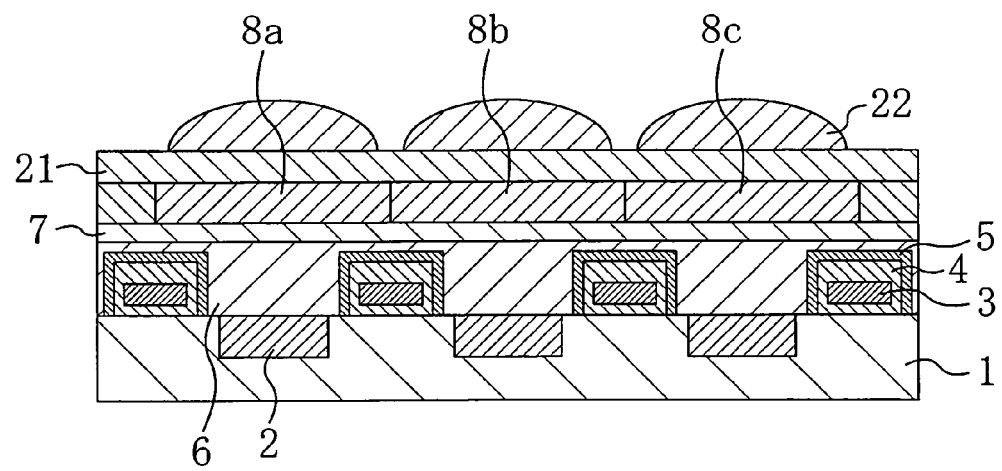

Then, the shape of the lens template layer 23 is transferred to the lens layer 22 as shown in FIG. 17B. This transfer is carried out by dry etching under a condition that the etching speed for the lens template layer 23 and the etching speed for the lens layer 22 are substantially the same. For example, this dry etching is carried out with a mixed gas of $CF_4$ and $O_2$. When this mixed gas is used, the etching is carried out while a material containing carbon and fluorine is deposited at the sides of the lens template segments 23, such that the distance between adjacent lenses 22 (lens gap) is smaller than the distance between adjacent lens template segments 23.

In embodiment 10, the lens layer 22 is formed from a material sheet. Thus, it is not necessary to dilute the material of the lens layer 22 with a solution into varnish as is in a conventional technique. Therefore, the stability of the material of the lens layer 22 is improved. Further, decrease in the refractive index due to deterioration in the electron density of the lens layer 22 can be prevented.

Other Embodiments

The solid state imaging devices described in embodiments 1-5 can be applied to digital cameras.

Figure 18:
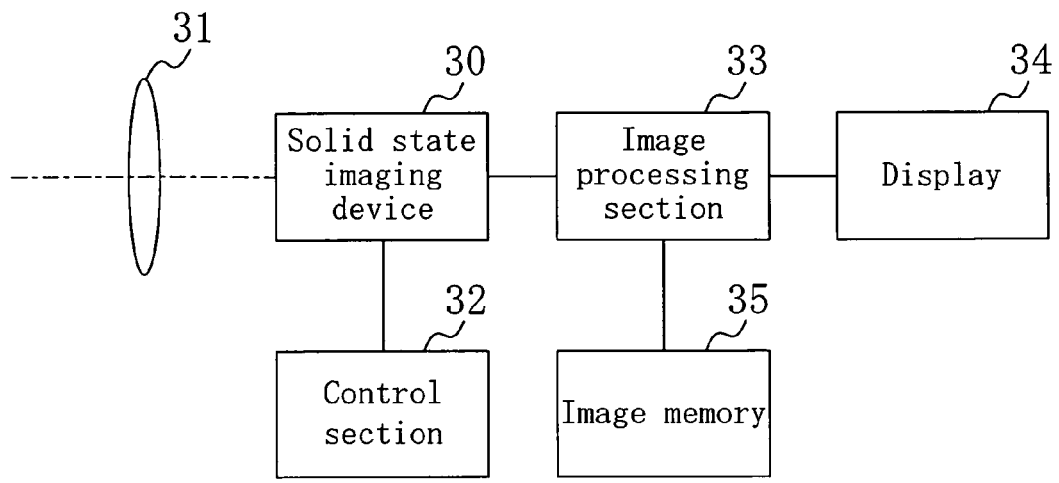
FIG. 18 is a block diagram showing a general structure of a digital camera which incorporates a solid state imaging device of the present invention.
Figure 19:
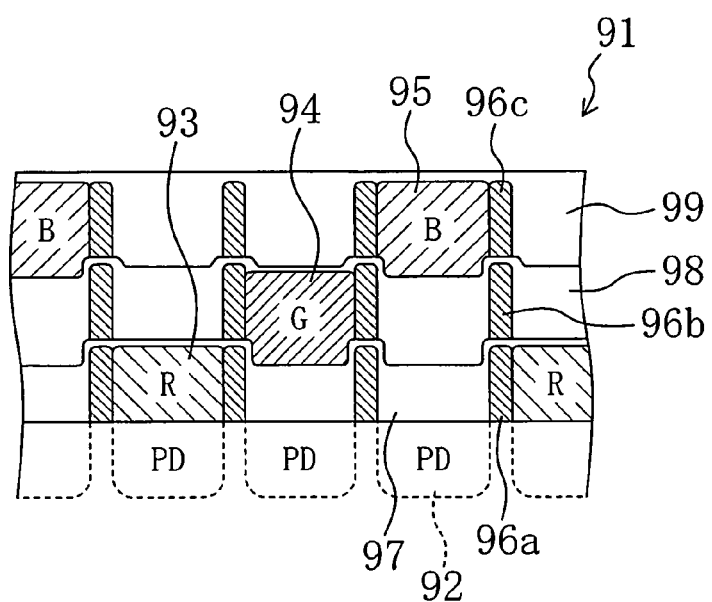
FIG. 19 is a cross-sectional view schematically showing a structure of a conventional color solid state imaging device.

FIG. 18 is a block diagram showing a general structure of a digital camera which incorporates a solid state imaging device of the present invention. As shown in FIG. 18, the digital camera of the present invention includes: a solid state imaging device 30; an optical system 31 which includes lenses for focusing light that comes from an object to form an image on an imaging surface of the solid state imaging device 30; a control section 32 for controlling the operation of the solid state imaging device 30; an image processing section 33 for performing various signal processes on a signal output from the solid state imaging device 30; a display 34 for displaying an image signal processed in the image processing section 33; and an image memory 35 for storing the image signal processed in the image processing section 33.

In a digital camera which uses a solid state imaging device of the present invention, color mixture is prevented. Therefore, a digital camera of high picture quality can be realized at a low cost.

The digital camera of the present invention may be any of a still camera which can only take still pictures, a video camera which can only take moving pictures, and a camera which can take both still pictures and moving pictures.

What is claimed is:

1. A solid state imaging device, comprising:
a semiconductor substrate;
a plurality of light receiving elements arranged in a matrix configuration on the semiconductor substrate;
a plurality of color filter segments provided above the light receiving elements, the color filter segments being mutually separated;
a transparent wall provided between the plurality of color filter segments;
a flattening film provided over the color filter segments and the transparent wall; and
a light collector provided above the color filter segments for collecting light on the light receiving elements,
wherein the transparent wall has a refractive index lower than that of the color filter segments, and
wherein the material of the flattening film is different from that of the transparent wall.

2. The solid state imaging device according to claim 1, wherein:
the semiconductor substrate is a part of a chip;
in a central region of the chip, side surfaces of the color filter segments are perpendicular to an upper surface of the semiconductor substrate; and
in a region outside the central region of the chip, side surfaces of the color filter segments are inclined from a direction perpendicular to the upper surface of the semiconductor substrate.

3. The solid state imaging device according to claim 1, wherein:
the semiconductor substrate is a part of a chip;
in a central region of the chip, the transparent wall exists above the boundaries between the light receiving elements; and
in a region outside the central region of the chip, the transparent wall is displaced from positions above the boundaries between the light receiving elements.

4. The solid state imaging device according to claim 1, wherein each of the color filter segments has a downwardly tapered shape.

5. The solid state imaging device according to claim 1, further comprising an underlying film under the color filter segments,
wherein the transparent wall is also formed in parts of the underlying film.

6. The solid state imaging device according to claim 1, wherein the transparent wall is also formed in parts of the flattening film.

7. A camera which incorporates the solid state imaging device of claim 1.

8. The camera according to claim 7, further comprising an optical system which includes lenses for focusing light that comes from an object to form an image on an imaging surface of the solid state imaging device.

9. The camera according to claim 7, further comprising a control section for controlling the operation of the solid state imaging device.

10. The camera according to claim 7, wherein the camera is a still camera which can only take still pictures.

11. The camera according to claim 7, wherein the camera is a video camera which can only take moving pictures.

12. The camera according to claim 7, wherein the camera is a camera which can take both still pictures and moving pictures.

13. The camera according to claim 7, further comprising an image processing section for performing various signal processes on a signal output from the solid state imaging device.

14. The camera according to claim 13, further comprising a display for displaying an image signal processed in the image processing section.

15. The camera according to claim 13, further comprising an image memory for storing the image signal processed in the image processing section.

16. The solid state imaging device according to claim 1, further comprising a BPSG film provided between the semiconductor substrate and the plurality of color filter segments.

17. The solid state imaging device according to claim 1, further comprising a $SiO_2$ film provided between the semiconductor substrate and the plurality of color filter segments.

18. The solid state imaging device according to claim 1, further comprising a polyimide resin film provided between the semiconductor substrate and the plurality of color filter segments.

19. The solid state imaging device according to claim 1, further comprising an epoxy resin film provided between the semiconductor substrate and the plurality of color filter segments.

20. The solid state imaging device according to claim 1, further comprising an acrylic resin film provided between the semiconductor substrate and the plurality of color filter segments.

21. The solid state imaging device according to claim 1, further comprising a urethane resin film provided between the semiconductor substrate and the plurality of color filter segments.

22. The solid state imaging device according to claim 1, further comprising a phenol resin film provided between the semiconductor substrate and the plurality of color filter segments.

23. The solid state imaging device according to claim 1, further comprising a silicone resin film provided between the semiconductor substrate and the plurality of color filter segments.

24. The solid state imaging device according to claim 1, wherein the flattening film is an acrylic resin film.

25. The solid state imaging device according to claim 1, wherein the solid state imaging device is a CCD solid state imaging device.

26. The solid state imaging device according to claim 1, wherein the solid state imaging device is a MOS solid state imaging device.

* * * * *